United States Patent [19]

Buchana et al.

[11] Patent Number: 5,543,589
[45] Date of Patent: Aug. 6, 1996

[54] TOUCHPAD WITH DUAL SENSOR THAT SIMPLIFIES SCANNING

[75] Inventors: William A. Buchana, Scotland; Richard A. Eardley; Anthony R. Tizzard, all of Scotland, United Kingdom; Brian G. Utley, Boca Raton, Fla.

[73] Assignee: International Business Machines Corporation, Armonk, N.Y.

[21] Appl. No.: 247,730

[22] Filed: May 23, 1994

[51] Int. Cl.⁶ .............. G08C 21/00; G09G 3/02
[52] U.S. Cl. .............. 178/18; 178/19; 178/20; 345/173; 345/174; 345/175; 345/179
[58] Field of Search .............. 178/18–20; 345/173–175, 345/179

[56] References Cited

U.S. PATENT DOCUMENTS

| 3,798,370 | 3/1974 | Hurst | 178/18 |
|---|---|---|---|
| 4,315,238 | 2/1982 | Eventoff | 338/99 |
| 4,455,450 | 6/1984 | Margolin | 178/18 |
| 4,463,232 | 7/1984 | Takakuwa | 200/159 B |
| 4,529,959 | 7/1985 | Ito et al. | 178/18 |
| 4,570,149 | 2/1986 | Thornburg et al. | 178/20 |
| 4,638,118 | 1/1987 | Wang | 178/20 |
| 4,736,190 | 4/1988 | Fiorella | 345/179 |
| 4,908,612 | 3/1990 | Bromley et al. | 345/177 |
| 5,061,803 | 10/1991 | Ambrose | 361/398 |
| 5,149,918 | 9/1992 | Kozik | 178/18 |
| 5,159,159 | 10/1992 | Asher | 178/18 |
| 5,272,470 | 12/1993 | Zetts | 345/173 |
| 5,329,070 | 7/1994 | Knowles | 345/177 |

*Primary Examiner*—Stephen Chin
*Assistant Examiner*—Vijay Shankar
*Attorney, Agent, or Firm*—Anthony N. Magistrale

[57] ABSTRACT

Disclosed is a dual sensor comprising first and second touchpad sensors having different resolutions and being sandwiched to form a single sensor. Each of the touchpad sensors include a first plurality of electrically conductive strips positioned proximate to a second plurality of electrically conductive strips. The conductive strips in each plurality lie substantially in a single plane and the two pluralities are skewed relative to one-another in plan view. The conductive strips are separated by insulators that extend beyond the surface of the conductors to separate the conductors of one plurality from the conductors of the other plurality until a localized pressure is applied to a region of the pad. Two such touchpad sensors are sandwiched to form the dual sensor of the present invention. The two touchpad sensors are configured and positioned such that a single touch of a finger, stylus, or the like is capable of being detected by both sensors.

16 Claims, 23 Drawing Sheets

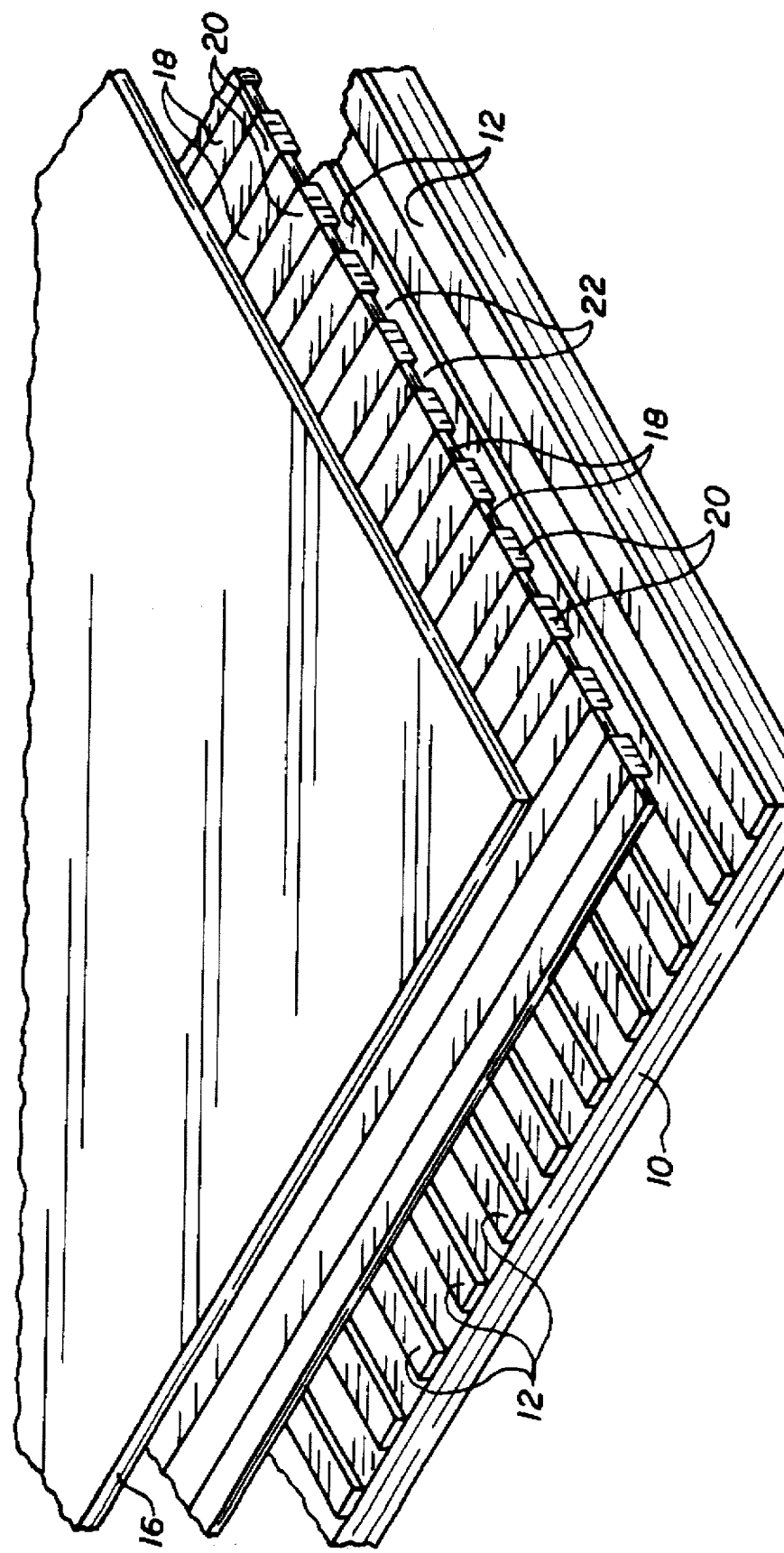

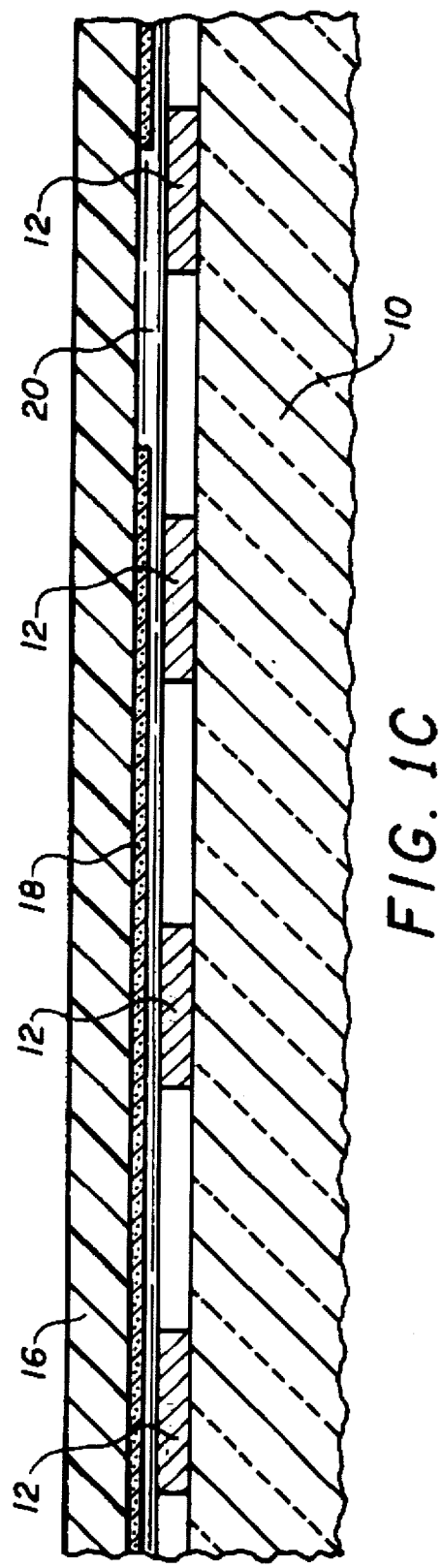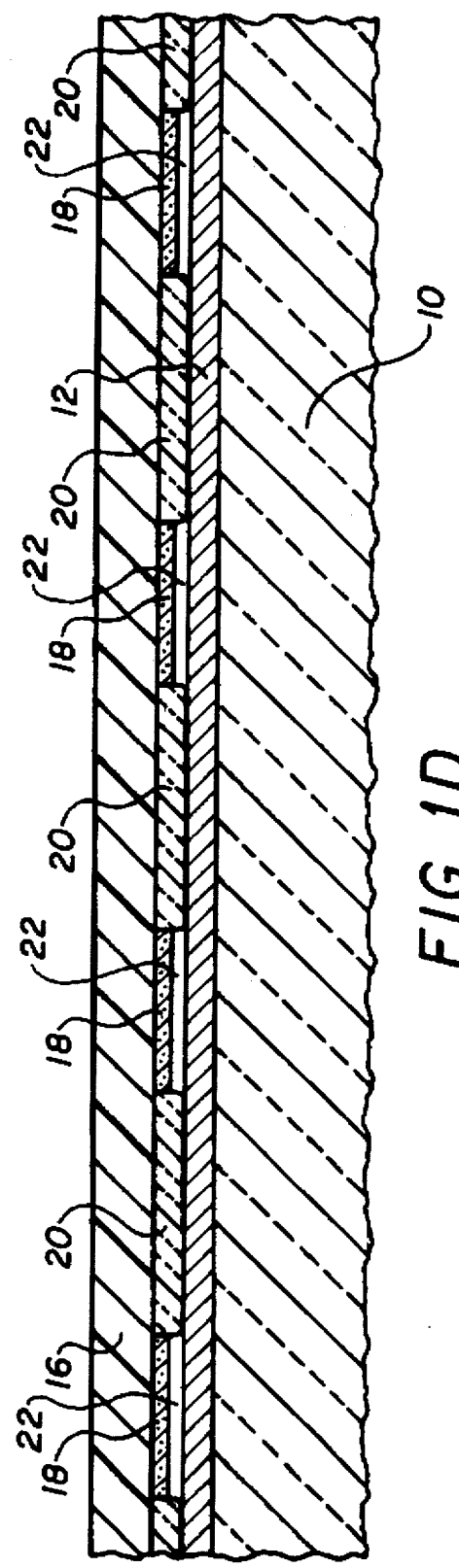
FIG.1C
FIG.1D

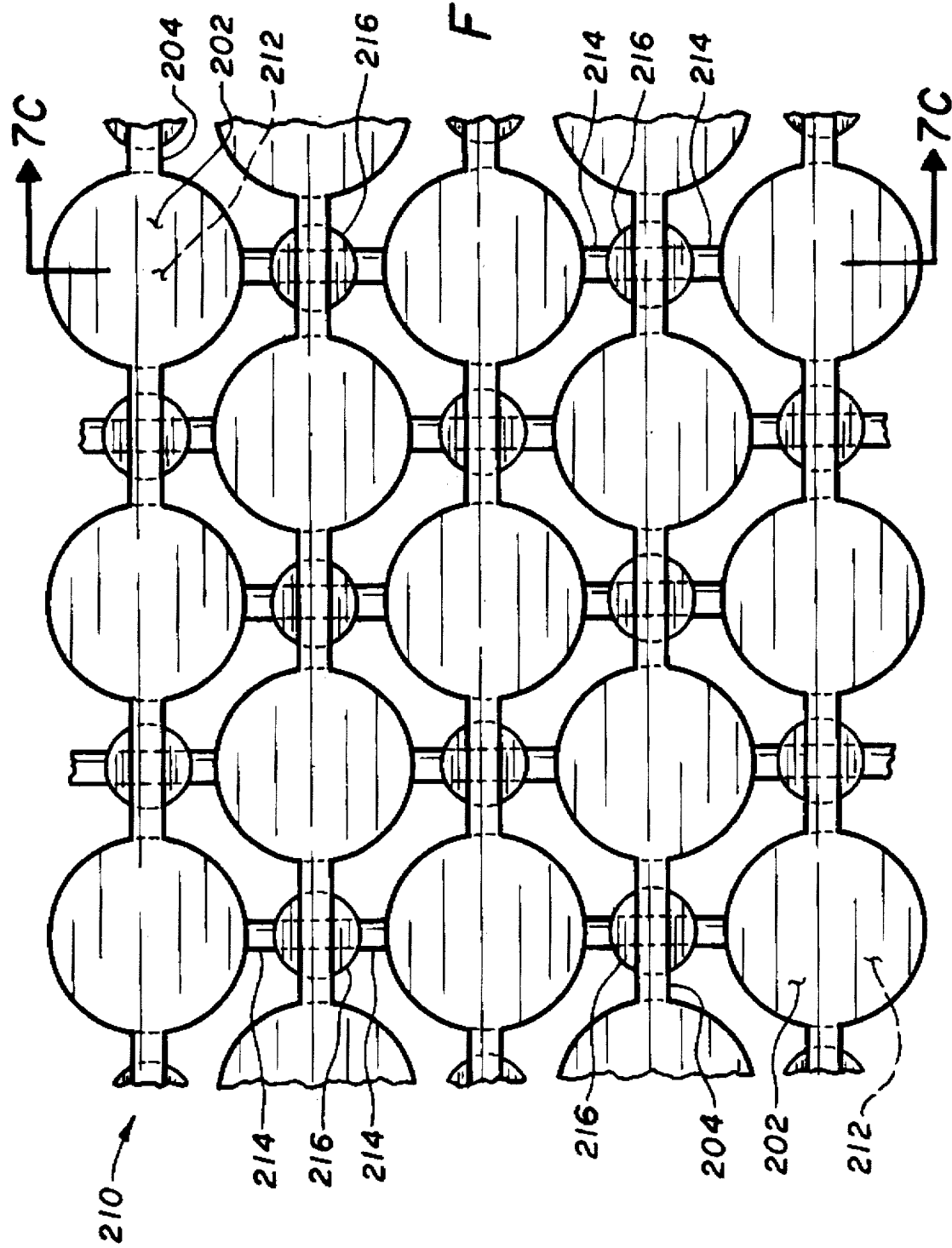

TOUCHPAD WITH DUAL SENSOR THAT SIMPLIFIES SCANNING

RELATED APPLICATIONS

This application is related to the application identified as Ser. No. 08/247,840, filed May 23, 1994, and entitled "SIMPLIFIED DIGITAL PAD SENSOR" (further identified as Attorney Docket BC9-93-042 (21322-00185)).

FIELD OF THE INVENTION

The present invention relates generally to input devices for digital electronic systems and, more specifically, to a dual resolution digital pad sensor for inputting coordinate-type data to computer systems.

BACKGROUND OF THE INVENTION

Touchpads, also known as digital pads, are coordinate type pointing devices used to input coordinate type data to computer systems and computer-controlled devices. A touchpad is typically a pressure-sensitive bounded plane capable of detecting localized pressure at its surface. When a user touches the surface with a finger, stylus, or the like, the circuitry associated with the touchpad determines and reports to the attached computer system the coordinates of the location touched. In response, the computer performs the function, if any, associated with the location pressed.

Typically one or more regions of the touchpad are assigned to certain functions within the system. The user is made aware of what function is associated with each region by a template. A template is a sheet with a graphic design and is typically placed over and in contact with the touchpad surface. The graphic design typically maps out regions of the touchpad surface and the regions are typically labeled to provide a reminder to the user as to the functions associated with the various mapped regions.

A touchpad's sensor is the heart of the touchpad. Several types of touchpad sensors are known in the art, such as switch closure type sensors. For example, a keyboard sensor having matrix of membrane switches is disclosed in U.S. Pat. No. 4,736,190 to Florella. A touch by a finger on a key causes a closure event between a pair of conductors. As with other switch closure type sensors, the location of the touch is detected using a bank of digital signal drivers and a bank of digital signal receivers.

Other devices known in the art are very complex. For example, U.S. Pat. No. 4,529,959 to Ito et al. discloses a sensor for a coordinate type input device comprising a braided lattice of conductors embedded in a compressible open-cell insulating material sandwiched between two insulating layers coated with a resistive material. Another sensor is shown in U.S. Pat. No. 4,455,450 to Margolin. This sensor involves resistive sheets sealed into a "pillow" form.

Typically one digital signal driver per row and one digital signal receiver per column is used. In high-resolution devices, the large number of drivers required significantly adds to the cost of the scanning electronics and, therefore, the cost of the touchpad. For example, a touchpad that is 640 rows by 480 columns will require 480 drivers and 640 receivers for a total of 1120 (640+480=1120) individual device pins. An electrical device having 1120 pins can be prohibitively expensive using programmable logic devices (PLDs) or even an application specific integrated circuit (ASIC).

In addition, high-density devices can have a relatively slow response time because each driver is sequentially activated and each receiver must be checked for each driver. A matrix that is 640 rows by 480 columns can require as many as 307,200 individual scans, because each row is sequentially driven by the drivers and each column must be scanned for each driven row.

It is therefore desirable to provide a high-resolution touchpad sensor without the need for a correspondingly large number of drivers and receivers.

It is also desirable to provide a touchpad sensor suitable for simplified scanning with a corresponding increase in the scanning bandwidth.

SUMMARY OF THE INVENTION

According to the present invention, a touchpad sensor is provided having two integrated sensors: a low-resolution sensor and a high-resolution sensor. The two sensors are positioned such that they overlap and such that applying pressure with a finger, stylus, or the like causes two events: a detection event at the first sensor and a detection event at the second sensor.

In one embodiment of the dual sensor of the present invention, the sensors have a first plurality of electrically conductive strips positioned proximate to a second plurality of electrically conductive strips. The conductive strips in each plurality lie substantially in a single plane and the two pluralities are skewed relative to one-another when viewed from the top. Ideally, the pluralities are aligned orthogonally. In both pluralities, the conductive strips are separated by insulating strips that extend beyond the surface of the conductors to separate the conductors of one plurality from the conductors of the other plurality until a localized pressure is applied to a region of the pad. When a localized pressure is applied, the conductors and insulators deform until a conductor from the first plurality forms an electrically conducting path with at least one conductor from the second plurality.

In the dual sensor of the present invention, two of the sensors described above, one of which has wide conductors and the other of which has narrow conductors, are sandwiched in overlapping relationship to form a dual sensor with first, second, third, and fourth pluralities of conductors. The wide conductors are relatively few in number as compared to the narrow conductors. When a localized pressure is applied, the conductors and insulators deform until a conductor from the first plurality forms an electrically conducting path with at least one conductor from the second plurality and a conductor from the third plurality forms an electrically conducting path with at least one conductor from the fourth plurality.

This dual sensor greatly simplifies the scanning process. First, the wide conductors are scanned using drivers and receivers. Locating the position of the touch at the intersection of the wide row and wide column provides the position of the touch to within a rectangular area the size of one wide conductor. To determine the location of the touch to the accuracy of the narrow conductors, all the narrow conductors need not be scanned. Only the narrow conductors corresponding to that intersection need be scanned. Thus, the scanning process is simplified by significantly reducing the number of narrow conductors to be scanned; the number of narrow conductors to be scanned has been reduced to the number covered by the intersection of the wide conductors. Thus, the number of narrow scan drivers and receivers are reduced by the ratio of narrow conductors to wide conductors. Hundreds of driver scans can be avoided, thereby avoiding hundreds of thousands of overall scans. Thus, the time-savings associated with the dual sensor scan of the present invention can be quite significant.

The dual sensor embodiment described above is not overly complex and can be manufactured using standard lithography techniques and relatively inexpensive materials. Standard driver-receiver banks can be used to scan the touchpad sensor and detect the location of the touch.

This dual sensor concept can also be applied to sensors of different technologies, such as the devices mentioned in the Background, above. The dual sensor simplifies the scanning process regardless of the technology of the two sensors involved.

It is therefore an advantage of the present invention to provide a dual sensor that greatly simplifies and speeds up the scanning process by significantly reducing the number of drivers and receivers needed.

It is a further advantage of this invention to provide a dual sensor that greatly reduces the cost of the scanner needed to determine the location of the touch by significantly reducing the number of drivers and receivers needed.

These and other advantages of the present invention will become more apparent from a detailed description of the invention.

BRIEF DESCRIPTION OF THE DRAWINGS

In the accompanying drawings, which are incorporated in and constitute a part of this specification, embodiments of the invention are illustrated, which, together with a general description of the invention given above, and the detailed description given below serve to example the principles of this invention.

FIG. 1B is an exploded perspective view of the single sensor shown in FIG. 1A;

FIG. 1C is a front elevational view of the single sensor shown in FIG. 1A with parts broken away for clarity;

FIG. 1D is a side elevational view of the single sensor shown in FIG. 1A with parts broken away for clarity;

FIG. 7B is a top view of the embodiment of the sensor shown partially in FIG. 7A;

DETAILED DESCRIPTION OF THE PREFERRED EMBODIMENT

Figure 1A:
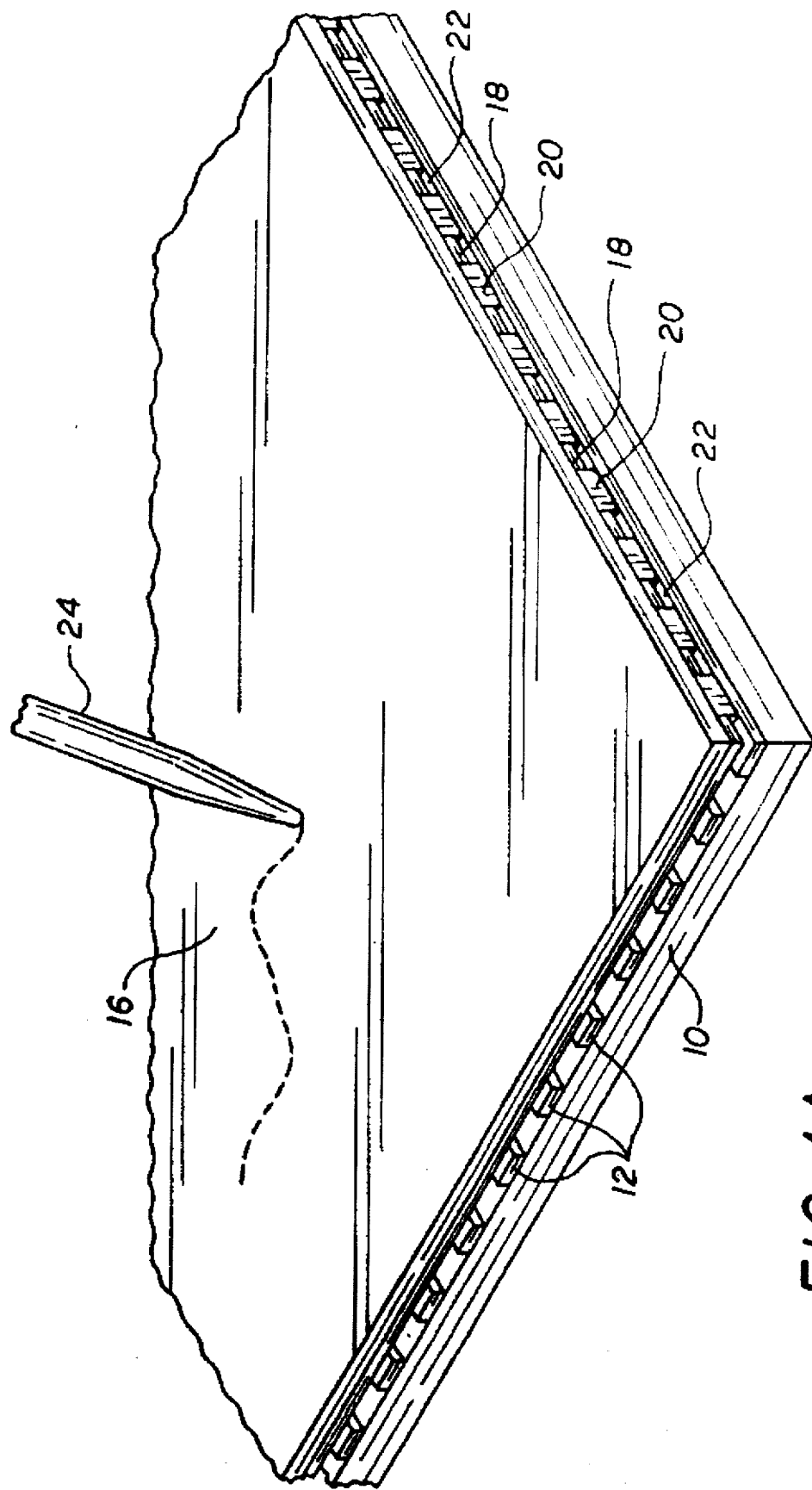
FIG. 1A is a perspective view of one embodiment of a single touchpad sensor, two of which form one embodiment of the dual sensor of the present invention.

Referring now to the drawings and for the present to FIGS. 1A–1E, one embodiment of a touchpad sensor is shown. This embodiment includes a first plurality of non-intersecting longitudinally extending spaced conductors formed on a first substrate, and a second plurality of non-intersecting conductors longitudinally extending on a second flexible substrate, separated by strips of resilient insulating material. The substrates are arranged to support the conductors in superposed spaced relationship, and with the first and second sets of conductors being positioned to extend skewed and preferably orthogonally with respect to each other and maintained by the insulating strips normally spaced from each other. With this configuration, pressure exerted upon the flexible substrate overcomes the resilience of the resilient insulating strips and which, together with the flexibility of the substrate and insulating strips, allows the portions of the first and second conductors at the location of the pressure to come into electrical contact with each other. This location of contact is defined in an X-Y axis on the planes of the conductors and can be translated by circuitry to be explained presently to a signal corresponding to the location of the pressure on the touchpad.

Specifically in this embodiment, a relatively rigid substrate 10 is provided which preferably is formed of glass-filled epoxy such as an epoxy circuit board material known as FR4. Typically, this board is about 2 mm thick, although other insulating materials of various thickness can be used. A plurality of spaced non-intersecting longitudinally extending x-conductors 12 are formed on the substrate 10. These x-conductors preferably are substantially equal in spacing and width and are preferably formed of copper with a Gold flash using conventional printed circuit board fabrication photoresist techniques. Either positive or negative photoresist may be used, and either additive or subtractive plating may be used, which techniques are well known in the art. One particularly desirable technique is to start with a substrate having 1 oz. copper plated thereon, and by lithographic technique expose and develop the photoresist and etch the revealed copper to form the desired conduction pattern under the remaining resist. This resist is then removed and the copper plated up to the desired structure-normally 0.036 mm. A Gold flash is then provided on the copper for oxidation resistance. This technique is well known in the printed circuit board industry. Thus, a plurality of longitudinally extending spaced x-conductors 12 are formed on the substrate 10. Of course, other techniques and materials such as screen printing of conductive inks could be used.

The touchpad also includes a flexible membrane 16 which preferably is formed of a polyester such as that sold by International Chemical Industries (ICI) of Great Britain or hard coated polyester sold by the E.I. du Pont Company. The preferred material is ICI Melinex ST525, which is manufactured by ICI Films, Wilton Centre, PO Box 90, Middlesbrough, Cleveland, TS90 8JE, United Kingdom. A hardened version of the ST525 is preferred and available from Cadillac Plastics, Rivermead Road, Westlea, Swindon, Wiltshire, United Kingdom. Membrane thicknesses of 0.003 inch and 0.005 inch have proved to be effective.

Deposited on the flexible membrane 16 are a plurality of non-intersecting y-conductors 18 which extend longitudinally thereon. In FIG. 1C, certain parts, including a portion of the y-conductor 18, have been partially cut away for clarity. The y-conductors 18 preferably are substantially equal in spacing and width and are preferably formed by printing with conductive ink using conventional mask printing techniques and conventional conducting inks such as epoxies with silver particles contained therein. One suitable screen printable conductive ink is available from Acheson Colloids, Prince Rock, Plymouth, Devon, United Kingdom.

Between the y-conductors 18 are strips of resilient insulating material 20. The strips of insulating material 20 are preferably Acheson ML25227, which is manufactured by Acheson Colloids, Prince Rock, Plymouth, Devon, United Kingdom, and available from NFI Electronics Ltd., Dodnor Industrial Estate, Newport, Isle of Wight, PO30 5XB, England. However, any material that is easily printed or applied in fine strips and that has sufficient flexibility (15,000 cycles measured under ASTM D2176 is sufficient), dielectric strength (125 KV/mm measured under ASTM D149 is sufficient), and surface resistivity ($10^{13}$ ohms/square measured under ASTM D257 is sufficient) can be used to make the insulating strips 20. The insulating strips 20 are applied using conventional screen printing techniques, as known to those skilled in the art.

The thickness of the y-conductors 18 preferably is about 12 micrometers, and the thickness of the resilient insulating strips 20 is approximately 22 micrometers. Therefore, the insulating strips 20 extend about 10 micrometers below the conductors 18. Consequently, when the insulators 20 are placed in contact with the conductors 12, as will be discussed presently, the conductors 12 are separated from the conductors 18 by approximately 10 micrometers.

In the figures, the edges of the conductors 18 are touching the edges of the insulators 20. This is an ideal condition. In practice, the printing mask for the insulators is slightly narrower than the spaces between the conductors 18. Therefore, when the insulating material is applied, a small gap exists between the insulator 20 and the adjacent conductor 18. The width of the gap (not shown) is not critical; it should be such that when the insulating material is applied and it spreads, no portion of the conductor is covered by the insulating material.

Also in the figures, each conductor 18 has an insulating strip 20 on either side of it. In the alternative, fewer insulating strips 20 might be sufficient to keep the conductors 12, 18 from contacting and causing an electrical short circuit. For example, every second or every second and third insulating strip 20 might be replaced with an air gap (not shown) between the conductors 18, in the manner the conductors 12 are separated from each other, as will be explained below.

As can best be seen in FIGS. 1B, 1C, and 1D, the substrate 10 and flexible membrane 16 are placed in superposed relationship with each other, with the conductors 12 and 18 facing each other and with the conductors 12 and 18 oriented skewed and preferably orthogonally with respect to each other, and in such a position that the insulating strips 20 are in contact with the x-conductor 12 on the substrate 10. Locating pins (not shown) are formed on the substrate 20 and coact with holes (not shown) in the membrane 16 to properly align the conductors 12 and 18. With the substrates so arranged and with the insulating strips 20 in contact with x-conductors 12, the conductors 12 and 18 are separated from each other by a gap 22, as seen best in FIG. 1D. The distance between the conductors 12 and 18 being about 10 micrometers since each of the resilient insulating strips 14 extend about 10 micrometers below the y-conductors 18. The 10 micrometer gap 22 normally is filled with air. However, since the interior of the touchpad is preferably sealed, as will be described presently, inert gas such as nitrogen or argon may be used, alternatively. However, normally an air gap is sufficient.

Figure 1E:
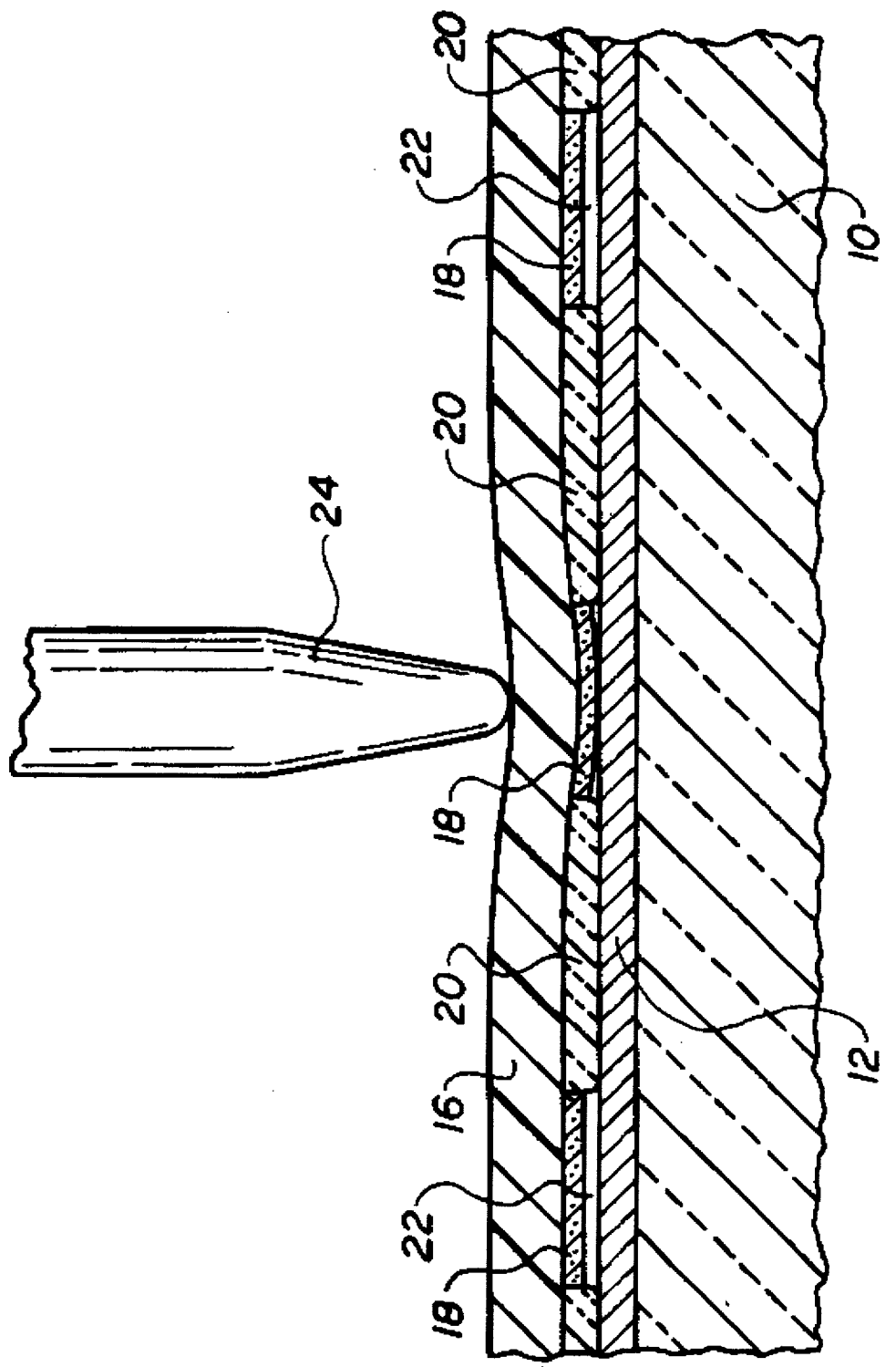
FIG. 1E shows the effects of pressure from a stylus on the sensor shown in FIG. 1D.

When a sufficient pressure is exerted such as by the point of a stylus 24, or a finger or the like, the flexible membrane 16 deflects as shown in FIG. 1E. The resiliency of the resilient insulator strips 20 and flexibility of the membrane 16 allow for the membrane 16 to deflect until portions of the conductors 18 and 12, which are opposed to each other, come into electrical contact with each other. The tip of the stylus 24 must be sufficiently small in diameter such that when pressure is applied, the tip forces the conductors together, as shown in that figure. If the tip is too big, then it is believed that it might rest between two insulators 20 without causing a closure event of two of the conductors 12, 18. Pressure from a finger tip suffices to cause a closure event because it is believed that the skin at the finger tip under pressure conforms to the insulators 20 enough to cause sufficient flexing to cause the conductors 12, 18 to touch. The contact of the conductors 12, 18 identifies a unique location on the X-Y axis of the touchpad to within the accuracy or resolution of the width of the conductors 12 and 18. The electrical circuitry and logic for such determination will be described presently.

The spacing and width of the conductors is selected based on the precision or resolution of the location desired to be identified. Of course, the more conductors per unit area, the more precise the location that can be identified that is being touched, i.e., the greater the resolution that can be achieved. In a typical touchpad, a desirable size is where the copper x-conductors 12 are about 0.008 inch wide, with the spaces therebetween being about 0.012 inch wide, which provides 50 lines per inch. The width of the y-conductors 18 on a typical embodiment is 0.012 inch, with the insulators 20 being 0.008 inch wide, thus also providing 50 lines per inch on the flexible membrane 16. It is believed that the conductors at a maximum can be approximately 0.25 inches wide, with the above-mentioned gap 22 of 10 micrometers.

In the above embodiment, the conductors are preferably equally spaced and of equal width. In the alternative, one or more of the x- or y-conductors can be much thicker. For example, if a region of the sensor is intended to be a row of dedicated function keys or icons, as is known in the art, a single x-conductor 12 can be as wide as the keys or icons. The coarse x-conductor can be printed with and adjacent to the fine x-conductors, as described above, and placed proximate to the y-conductors 18, separated by the insulators 20.

As will be described presently, the electrical circuitry and logic to determine the exact location of contact between conductors 12 and 18 performs a polling function of the various conductors 12 and 18 to determine where the contact is. While this is relatively fast, nevertheless in some instances, it is desirable to decrease the polling time and thus decrease the response time, especially where traces, such as handwriting, are to be mapped. In addition, in high-density sensors using discrete drivers and receivers, the number of electronic device pins becomes very high. For example, a 640 by 480 sensor would need 640 drivers and 480 receivers for a total of 1120 discrete device pins. Thus, it is also desirable to provide a touchpad sensor that requires fewer pins, yet maintains the simplicity of discrete drivers and receivers.

To these ends, the embodiment of touchpads shown in FIGS. 2A–2E are provided which, together with circuitry and logic which will be described presently, substantially reduces the time required for the determination of the location of a touch and significantly reduces the complexity of the required circuitry. In this embodiment, there are two sets of pairs of superposed conductors, each of which sets are actuated by a single touch of a stylus or finger or the like. One set is divided into very coarse or broad areas, i.e., having a rather coarse resolution, and the other set is divided into finer or narrow areas, i.e., having a rather fine resolution. As will be described presently, the coarse areas of resolution are polled to determine the general location of the touch, and the finer areas of resolution within the detected coarse area are polled to determine a more precise location within the general area. This substantially reduces the time needed to determine where the touch has occurred, thus decreasing the response time to a touch in any particular area as will be described presently with respect to the circuitry and logic.

Figure 2A:
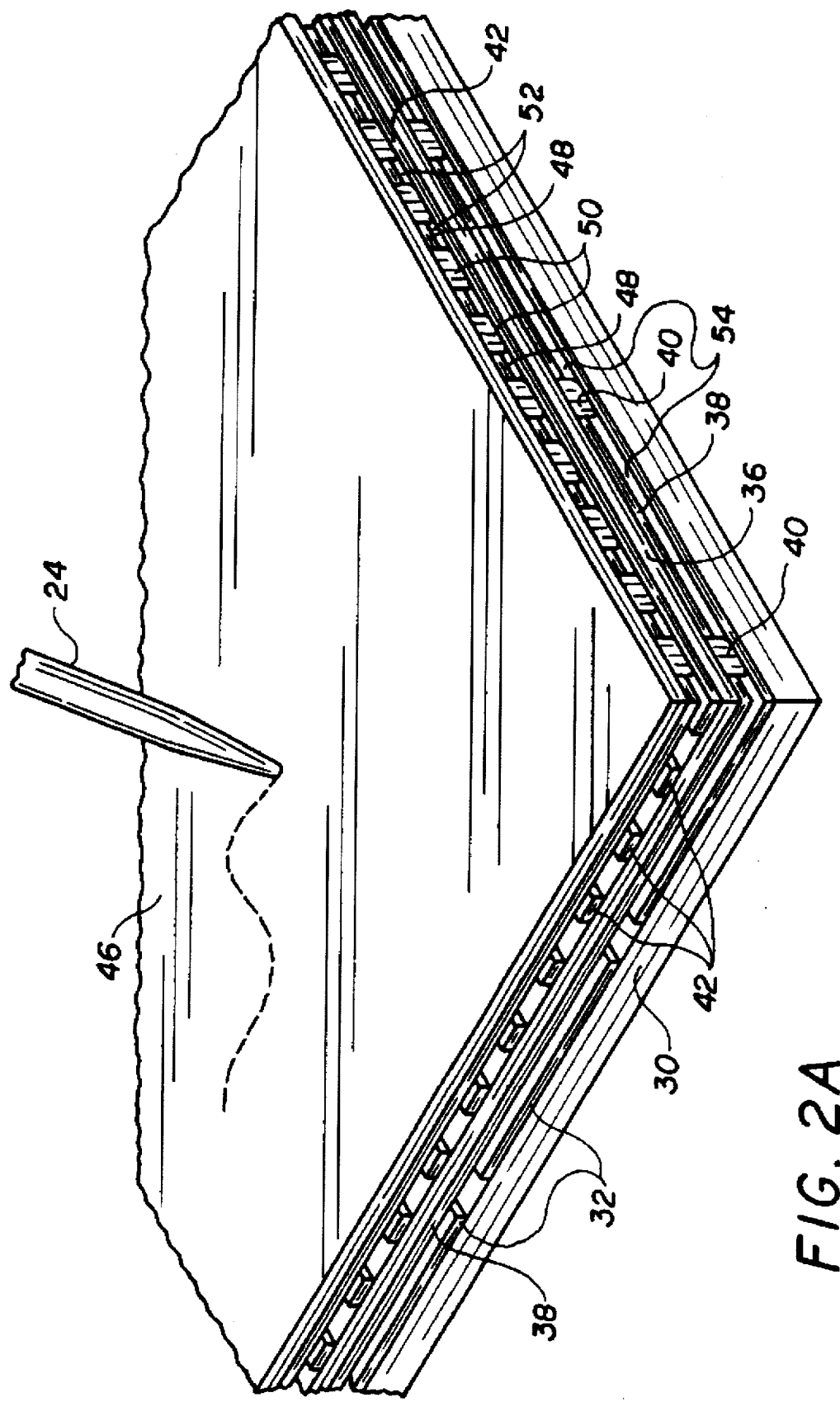
FIG. 2A is a perspective view of an embodiment of the dual sensor of the present invention.
Figure 2B:
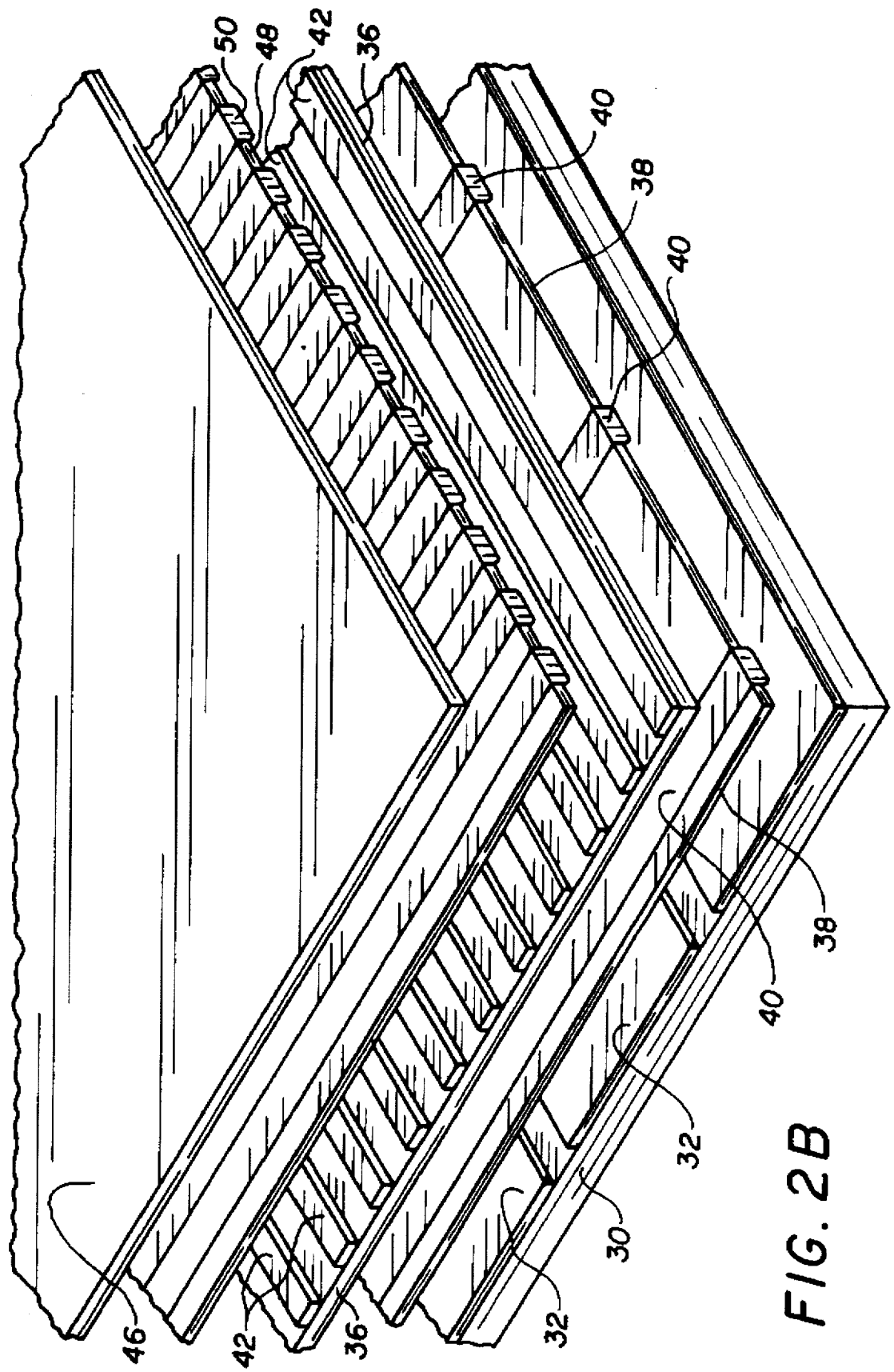
FIG. 2B is an exploded perspective view of the embodiment of the present invention shown in FIG. 2A.
Figure 2C:
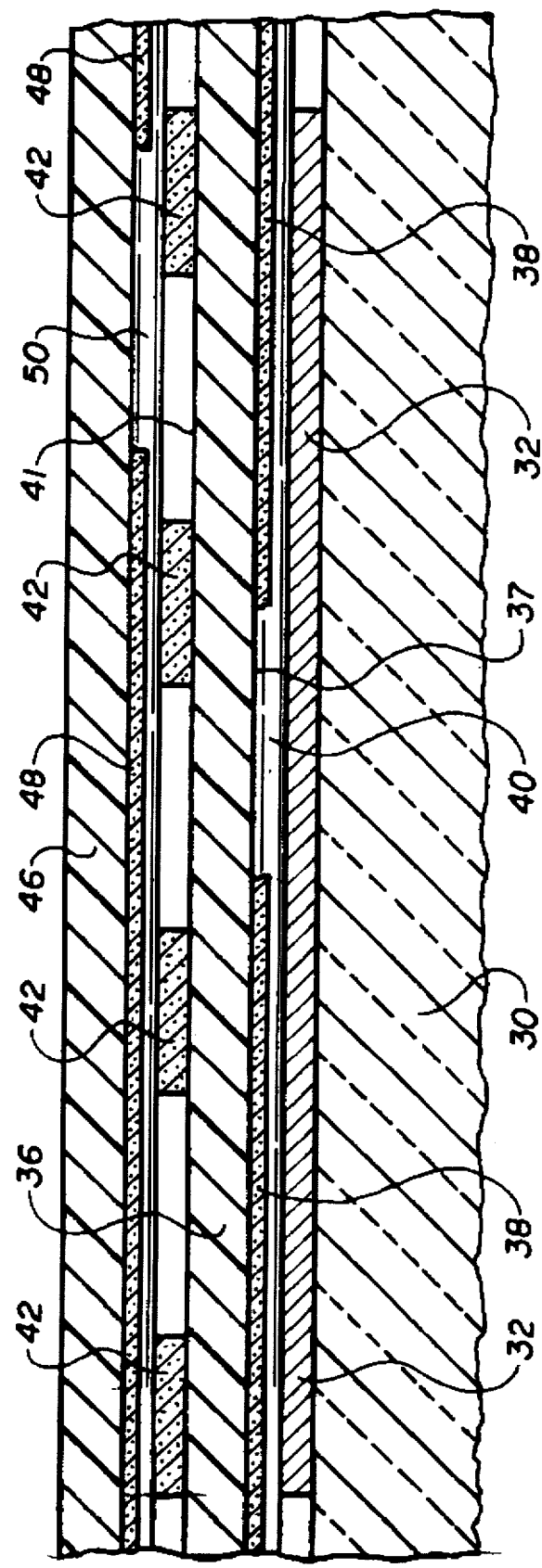
FIG. 2C is a front elevational view of the embodiment shown in FIG. 2A with parts broken away for clarity.
Figure 2D:
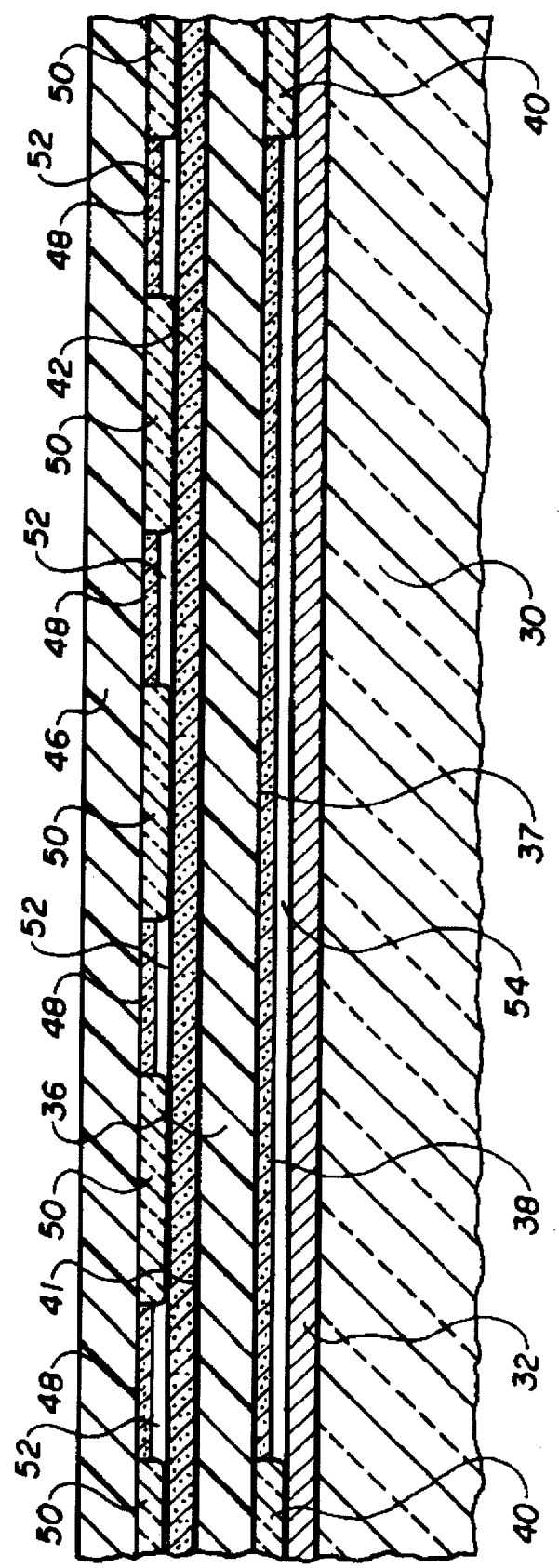
FIG. 2D is a side elevational view of the embodiment shown in FIG. 2A with parts broken away for clarity.

Referring now to FIGS. 2A–2E, an embodiment of the dual sensor of the present invention is shown. A substrate 30 is provided which in one embodiment is a glass filled epoxy printed circuit board such as the type previously described. Disposed on the substrate 30 are a plurality of copper coarse x-conductors 32 which are formed as previously described by any suitable technique, such as photolithography and the other printed circuit board fabrication steps mentioned above in regards to the conductors 12. A flexible membrane 36 is provided which is similar to membrane 16 of the previously described embodiment and which has formed on one side 37 thereof coarse y-conductors 38, separated by resilient insulating strips of material 40. In FIG. 2C, certain parts, including a portion of the coarse y-conductor 38, have been partially cut away for clarity. The coarse y-conductors 38 are preferably formed of conducting ink similar to the conductors 18 and the resilient insulating strips of material 40 are preferably the same material as the material for insulating strips 20 in the previous embodiment. Up to this point, the structure is substantially similar to that of the previously described embodiment, other than the width of the conductors 32 and 38 which are substantially wider than in the previous embodiment for a purpose which will be described presently.

Disposed on the opposite surface 41 of the flexible membrane 36 are another set of spaced longitudinally extending conductive materials or lines 42. These fine x-conductors 42 are formed by conventional conductive ink screening as previously described and are spaced and separated by an air gap (not shown) as are the conductors 32.

A second flexible membrane 46 is also provided on which longitudinally extending fine y-conductors 48 formed of conducting ink and separated by resilient insulating strips 50 are disposed. In FIG. 2C, certain parts, including a portion of the fine y-conductor 48, have been partially cut away for clarity. The strips 50 are deposited, as described above, between the conductors 48 and positioned adjacent to the conductors 42. In the alternative, the resilient strips 50 can be deposited between the conductors 42 and positioned adjacent to the conductors 48. The fine y-conductors 48 are positioned skewed and preferably orthogonally with respect to fine x-conductors 42. In this embodiment, there is an upper gap 52 between the upper conductors 42, 48, and a lower gap 54 between the lower conductors 32, 38. The gaps are as described in the text accompanying gap 22. In this embodiment, the width and spacing of the fine x-conductors 42 and the fine y-conductors 48 are substantially the same as the width and spacing of the conductors 12 and 16, respectively, in the previous embodiment. The width of coarse conductors 32 and 38 are selected such that they each are wide enough to encompass more than one and preferably up to 16 of the fine conductors 42 and 48, respectively. Thus, any contact between coarse conductors 32 and 38 represents potentially 256 contacts between fine conductors 42 and 48 (i.e., 16×16=256). Hence, when a gross area of contact has been identified by contact between coarse conductors 32 and 38 only the fine conductors 42 and 48 which have the possibility of being contacted, i.e., those fine conductors 42 and 48 which are within the gross area need to be polled— rather than all of the fine conductors 42 and 48 as is necessary in the previous embodiment when all of the conductors 12 and 18 need to be polled.

Figure 2E:
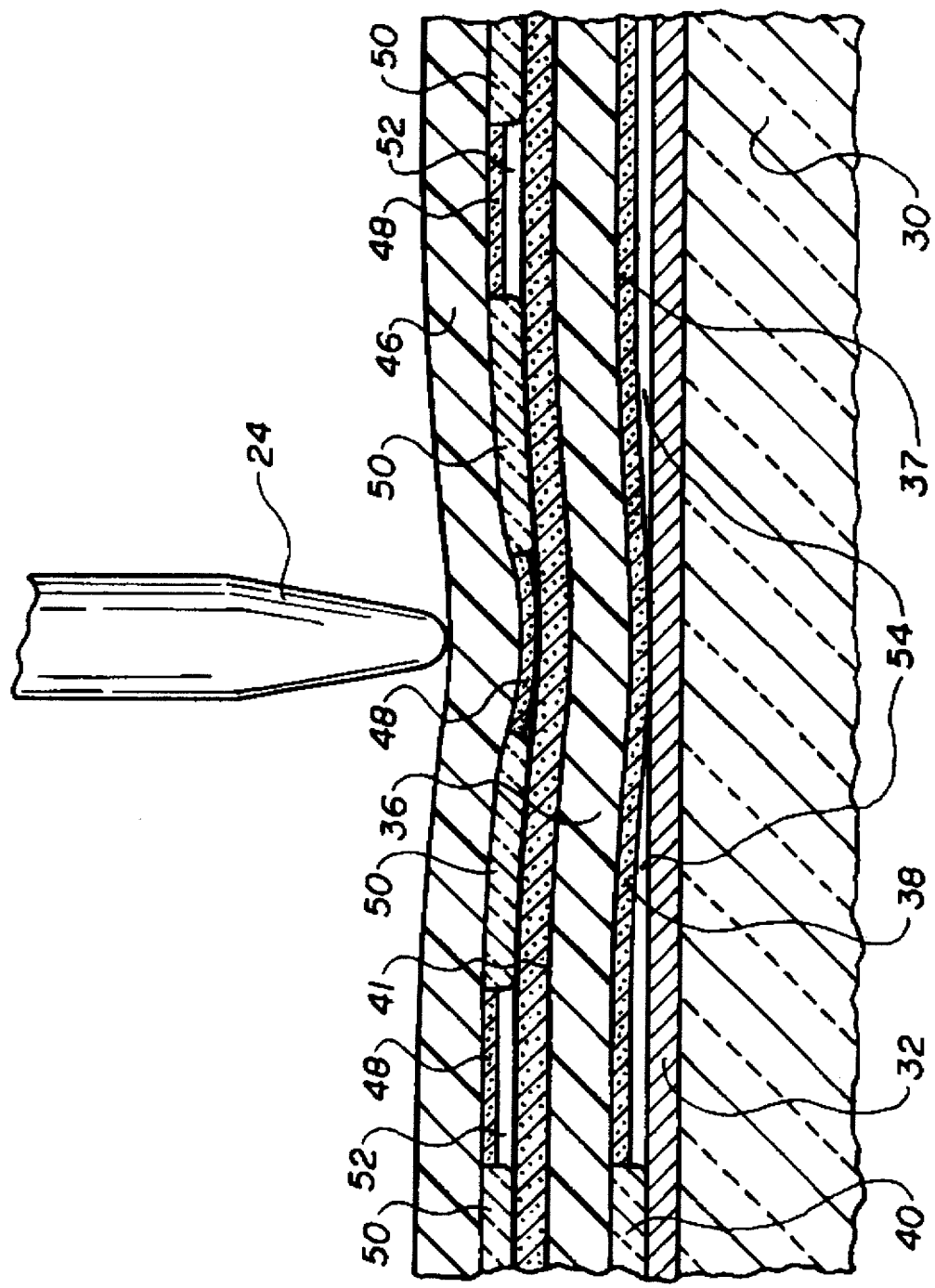
FIG. 2E shows the effects of pressure from a stylus on the embodiment of the present invention shown in FIG. 2C.
Figure 3A:
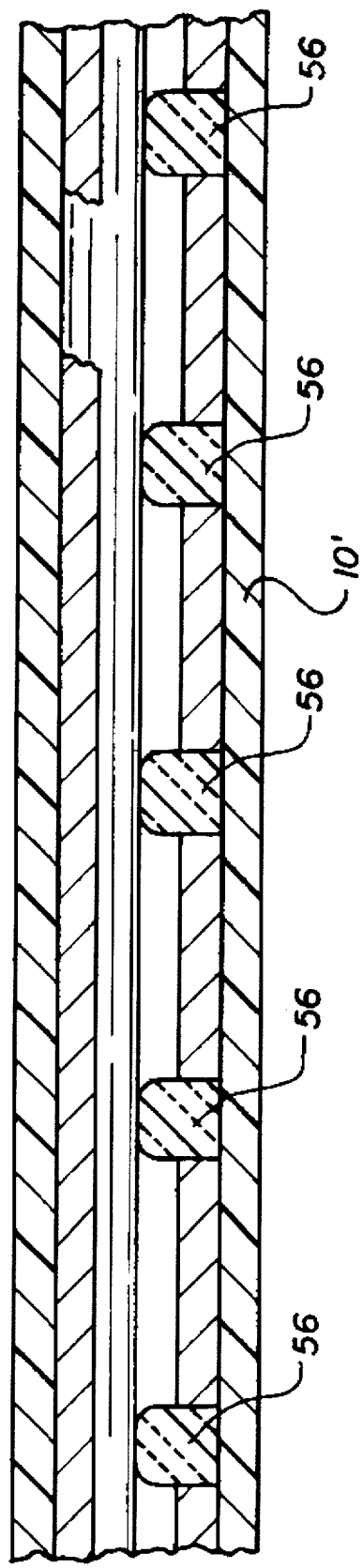
FIG. 3A is a front elevational view of another embodiment of the single sensor with parts broken away for clarity.
Figure 3B:
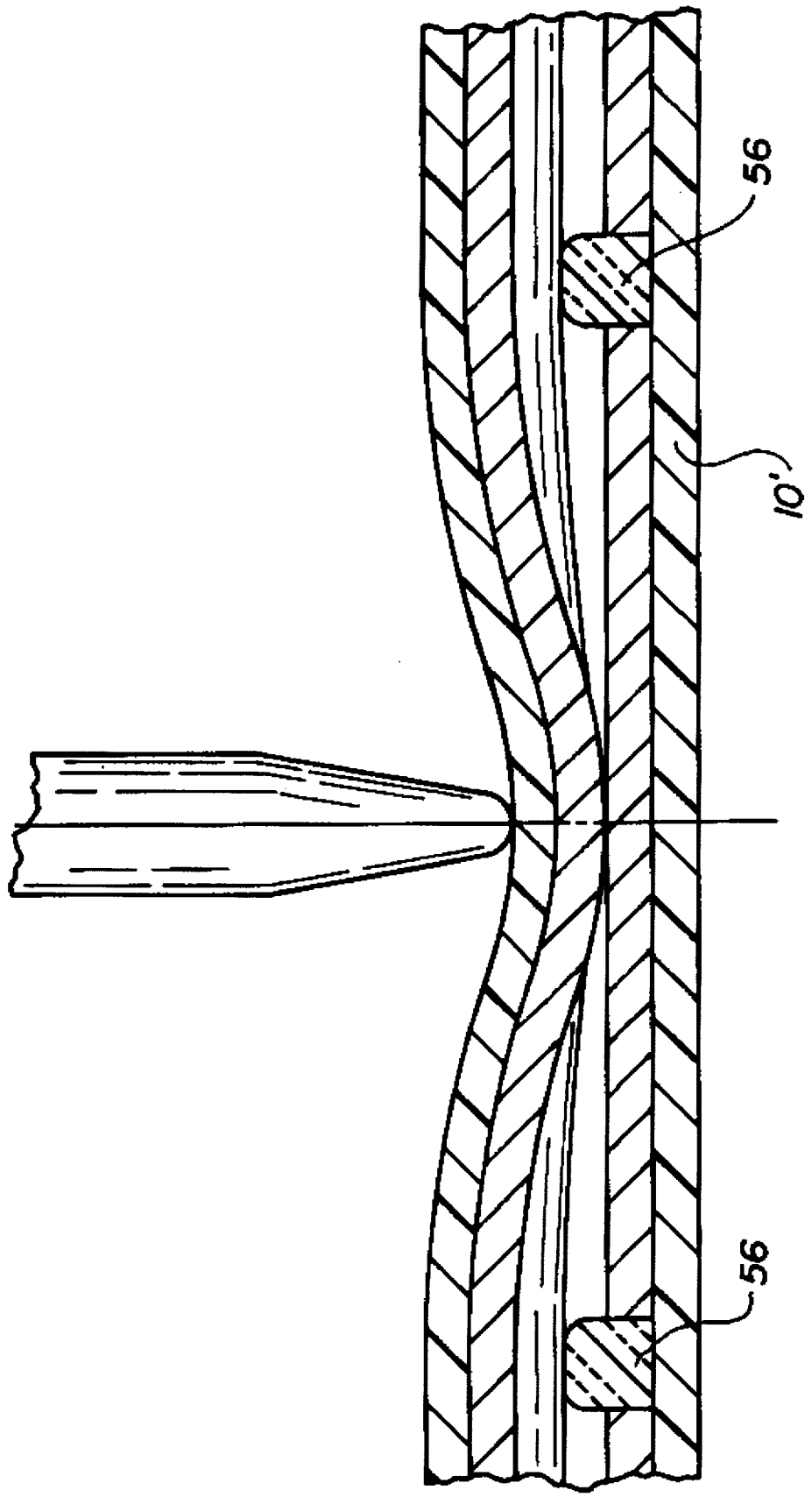
FIG. 3B shows the effects of pressure from a stylus on the single sensor shown in FIG. 3A.
Figure 4A:
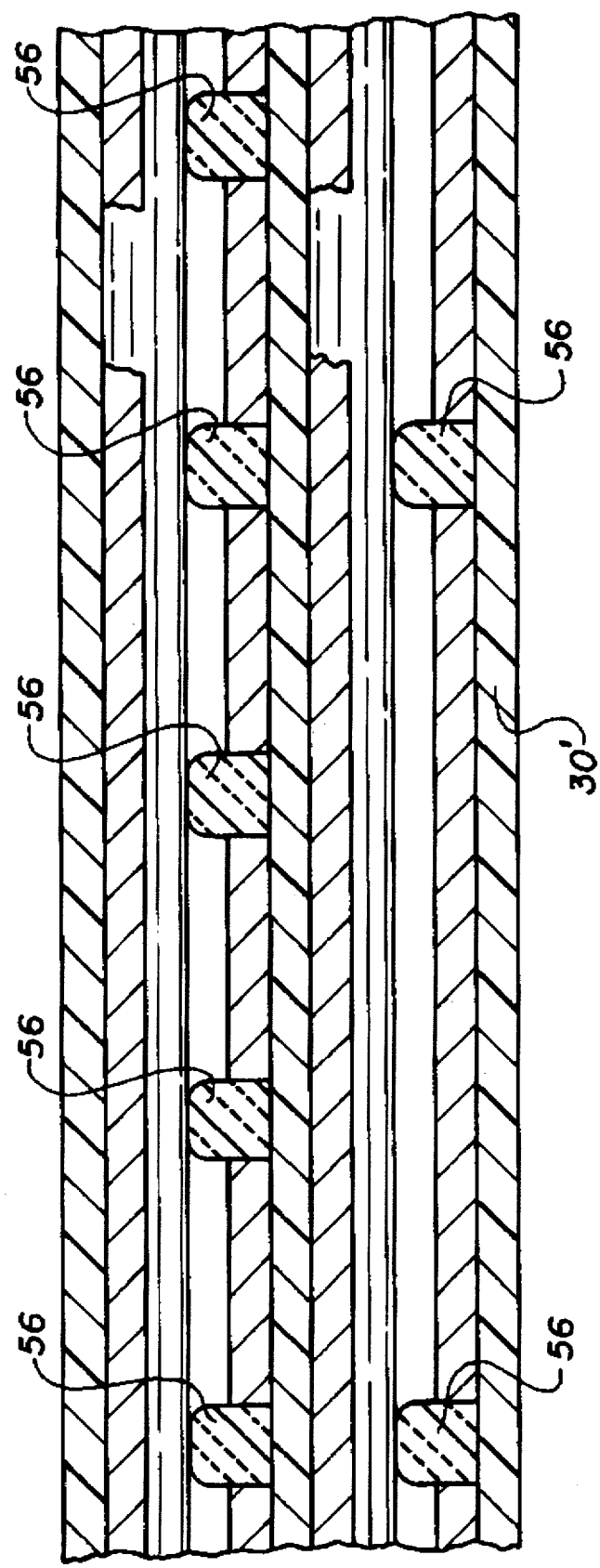
FIG. 4A is a front elevational view of another embodiment of the dual sensor of the present invention with parts broken away for clarity.
Figure 4B:
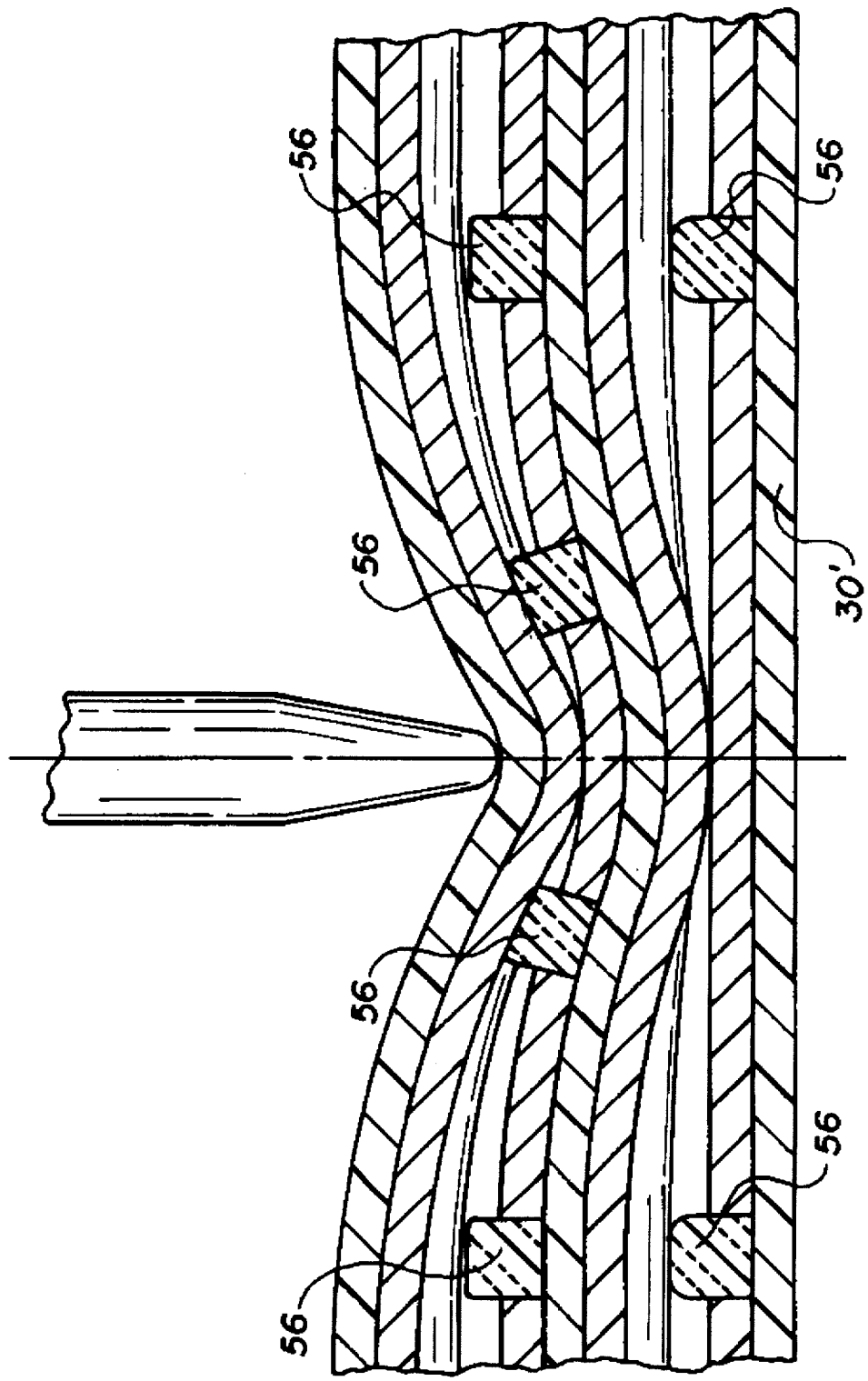
FIG. 4B shows the effects of pressure from a stylus on the embodiment of the present invention shown in FIG. 4A.

As can be seen in FIG. 2E, when the stylus 24 puts pressure on the flexible membrane 46, the deflection or deformation therebeneath of both membrane 46 and membrane 36 causes a dual or double superimposed contact action to take place. In one contact action, one of the coarse y-conductors 38 contacts one of the coarse x-conductors 32, and also one of fine x-conductors 42 contacts one of the fine y-conductors 48. As will be described presently, circuitry preferably provides for a polling first to determine the location of the contact of the coarse conductors 32 and 38, to determine a general area of contact. When a general area of contact has been determined, the specific area or more localized area of contact is determined by the location of the contact between the fine conductors 42 and 48.

Further, it is to be understood that the selection of specific materials may vary depending upon the specific characteristics desired in the touchpad. Just as one example, in the alternative, it may be desirable to have the entire touchpad flexible rather than have a rigid base. Such a sensor might be flexed and affixed to a nonplanar surface such as a cylinder or the viewing surface of a cathode ray tube or other display device.

As shown in FIGS. 3A–3B and 4A–4B, in such a case, the substrate 10 or substrate 30 can be replaced with a more flexible substrate 10' or 30', respectively, which indeed could be the same material as the flexible membranes 16, 36 and 46. In this case, the conductors 12 and 32 would be replaced with a more flexible conductor 12' or 32', respectively, which indeed could be the same material as the flexible conductors 18, 38, 42, and 48. Moreover, if more transparent materials are selected, this would provide some degree of transparency to the pad if so desired. Transparent inks well known in the art of LCD panel design allow fabrication of an essentially transparent unit. Other techniques and other conducting material can be used as can other resilient materials be used between the conductors. Also in the alternative, if desired, resilient strips of insulating material can be placed between conductors 12 and 18 or 32 and 38 on the substrate, as shown in FIGS. 3A, 3B, 4A, and 4B.

In the alternative, the central substrate 36 can have both conductors and insulators on both sides with the other two substrates 30, 46 only having conductors thereon. Many combinations and permutations are possible.

Figure 5A:
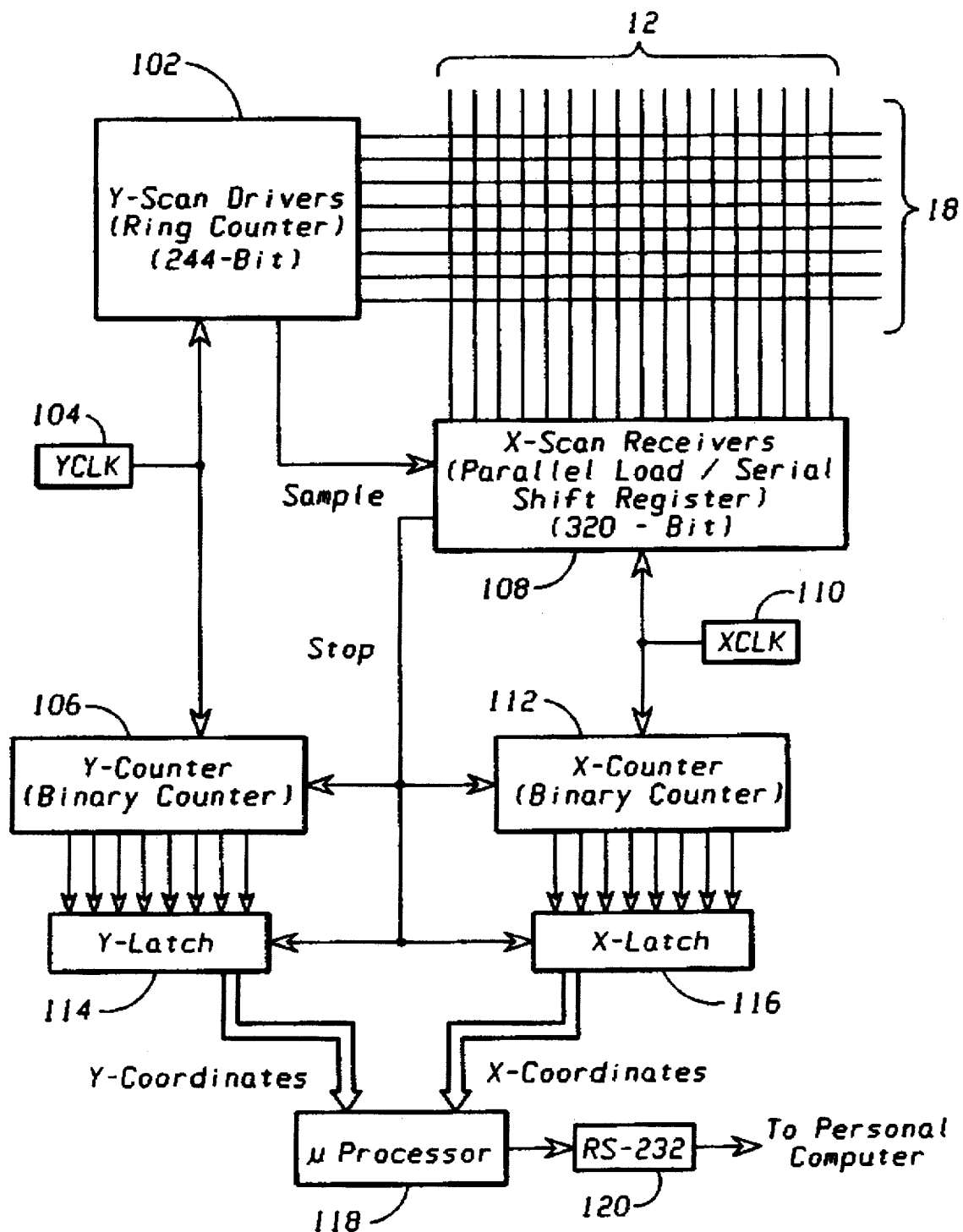
FIG. 5A is an electrical block diagram showing the major components of an embodiment of an electrical circuit for interfacing to the touchpad sensor shown in FIGS. 1A–1E.

Referring now to FIG. 5A, a block diagram of the electronics used to interface to the touchpad sensor is shown.

In circuit communication with the y-conductors 18 are y-scan drivers 102, one driver per conductor. The y-scan drivers 102 comprise a 244-bit self-starting ring counter, which is configured to pass a single logical ONE around the ring responsive to complete cycles of a YCLK 104, which is a free-running square-wave oscillator. As the logical ONE is passed around the ring, the y-conductors 18 are sequentially raised to a voltage corresponding to the logical one. As each y-conductor 18 is raised to a logical ONE, the YCLK 104 also causes a y-counter 106 to count. The y-counter 106 is a binary up counter configured to reset after counting 244 cycles of the YCLK 104. Thus, the value of the y-counter 106 is the number of the y-conductor currently at a voltage corresponding to a logical ONE.

Likewise, in circuit communication with the x-conductors 12 are x-scan receivers 108, one receiver per conductor. The x-scan receivers 108 comprise a 320-bit parallel load/serial shift register (PLSSR). During the time each y-conductor 18 is at the voltage corresponding to a logical ONE, the value of each of the x-conductors is latched into a corresponding bit of the PLSSR. Immediately after latching, all the x-values are shifted, one at a time, responsive to complete cycles of an XCLK 110, which is a free-running square-wave oscillator. As each individual x-conductor value is shifted, the XCLK 110 also causes an x-counter 112 to count. The x-counter 112 is a resettable binary up counter configured to count up responsive to complete cycles of the XCLK 110. Thus, the value of the x-counter 112 is the number of the x-conductor currently being shifted out of the PLSSR.

If the y-conductor that is being driven to a logical ONE is touching one of the x-conductors in the manner shown in FIG. 1E, then one of the latched x-conductor values will also be a logical ONE. On the other hand, if the y-conductor that is at a logical ONE is not touching one of the x-conductors in the manner shown in FIG. 1E, then all of the latched values will be a logical ZERO. Thus, if one of the x-conductor values is a logical ONE, then at the moment that one bit is shifted out of the PLSSR, the y-counter contains the y-coordinate of the touched region and the x-counter contains the x-coordinate of the touched region. Therefore, the counters are configured to disable counting responsive to a logical ONE being detected at one of the x-conductor values.

The coordinates stored in the disabled counters 106, 112 are latched into a y-latch 114 and an x-latch 116. The values are read by a microprocessor 118 or some other suitable processor and are transmitted via an RS-232 driver 120 to the attached personal computer (not shown).

Figure 5B:
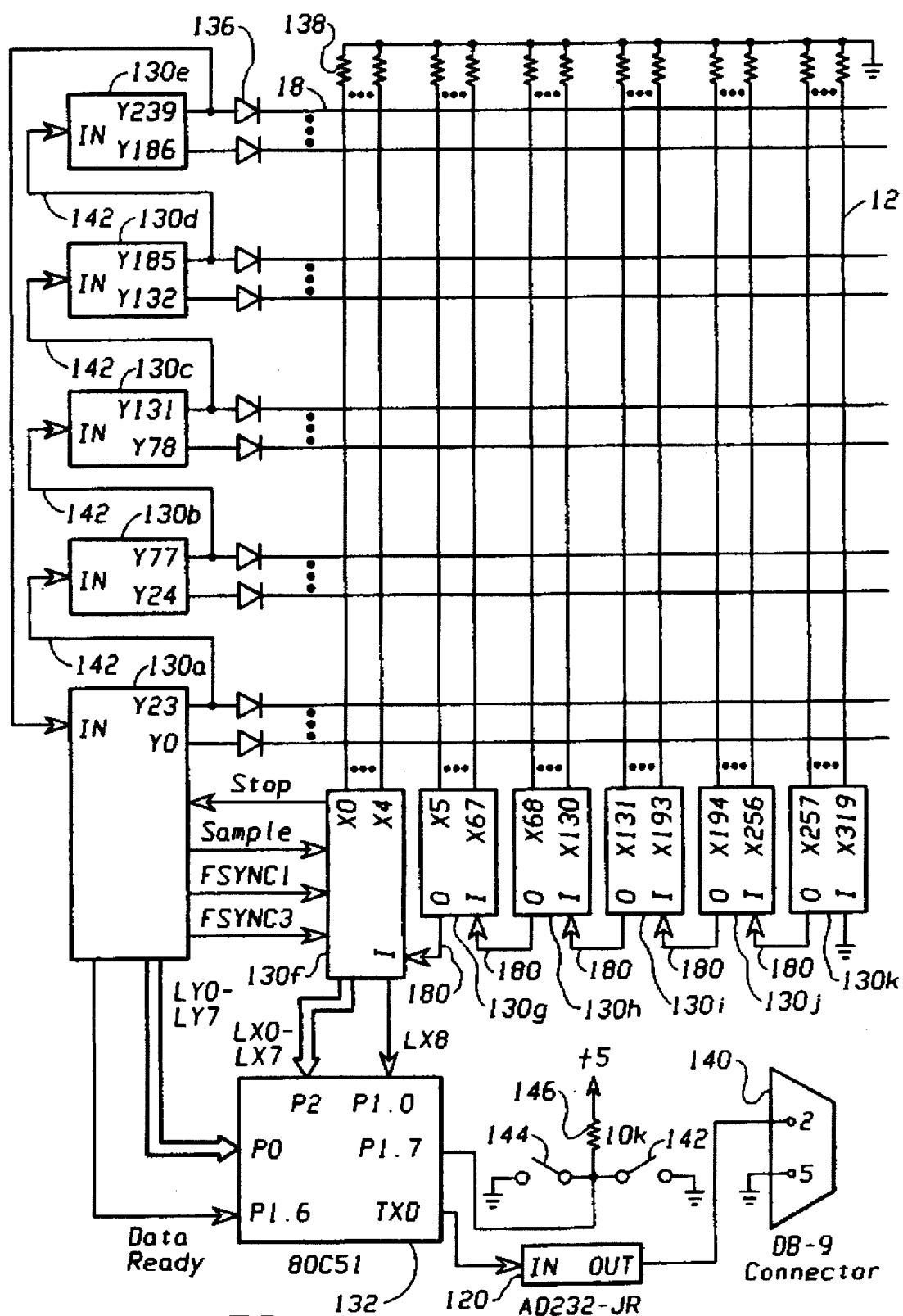
FIG. 5B is an electrical schematic diagram showing an implementation of the electrical circuit for interfacing to the touchpad sensor shown in FIGS. 1A–1E.

Referring now to FIG. 5B, a schematic circuit diagram of one embodiment of the circuit if FIG. 5A is shown. In this embodiment, the circuitry is implemented in eleven programmable logic devices (PLDs) 130a–130k, a microcontroller 132, and an RS-232 driver 120. All electronic devices are properly powered by a suitable power supply and power inputs are properly decoupled with decoupling capacitors (not shown), both of which are well known in the art.

The microcontroller 132 is an SC80C51FB-4F40, which is a programmable 8-bit microcontroller manufactured by Philips Components, Ltd., Mullard House, Torrington Place, London WC1E 7HP, United Kingdom, and is available from many distributors. Other microcontrollers can be used. The RS-232 driver 120 is an AD232-JR, manufactured by Analog Devices, One Technology Way, P.O. Box 9106, Norwood, Mass. 02062-9106, and is available from many distributors. Other RS-232 drivers can be used to drive the signals to proper RS-232 levels, as is known in the art. The PLDs 130a–130k are MACH230 PLDs, which are manufactured by Advanced Micro Devices, 901 Thompson Place, P.O. Box 3453, Sunnyvale, Calif. 94088-3000, and are available from many distributors. Other devices can be used to implement the circuitry.

The devices are connected in circuit communication, as shown in FIG. 5B. As shown in that figure, each of the y-driver outputs Y0–Y239 are connected to one of the y-conductors 18 via a small signal diode 136. The diodes 136 prevent damage to the EPLDs if two or more y-conductors are shorted together. Likewise, each of the x-receiver inputs X0–X319 are connected to one of the x-conductors 12. Each of the x-conductors are pulled down to a logical ZERO via a 10K pull-down resistor 138, to prevent the inputs of the x-receivers from floating.

Also shown in FIG. 5B is a DB-9 connector 140, a pair of switches 142, 144, and a 10 K pullup resistor 146, all in circuit communication as shown in that figure. The DB-9 connector 140 is used to connect the signals of the touchpad to a personal computer (not shown) or other device receiving coordinate data via a multiconductor cable.

The switches 142, 144 are used as supplemental inputs, similar to the buttons on a so-called "mouse" pointing device. Periodically, the microcontroller 132 reads port P1.7 to determine the state of the switches 142, 144 and sends an RS-232 signal corresponding to the switch state out of its TxD output, as is well known in the art.

Figure 5C:
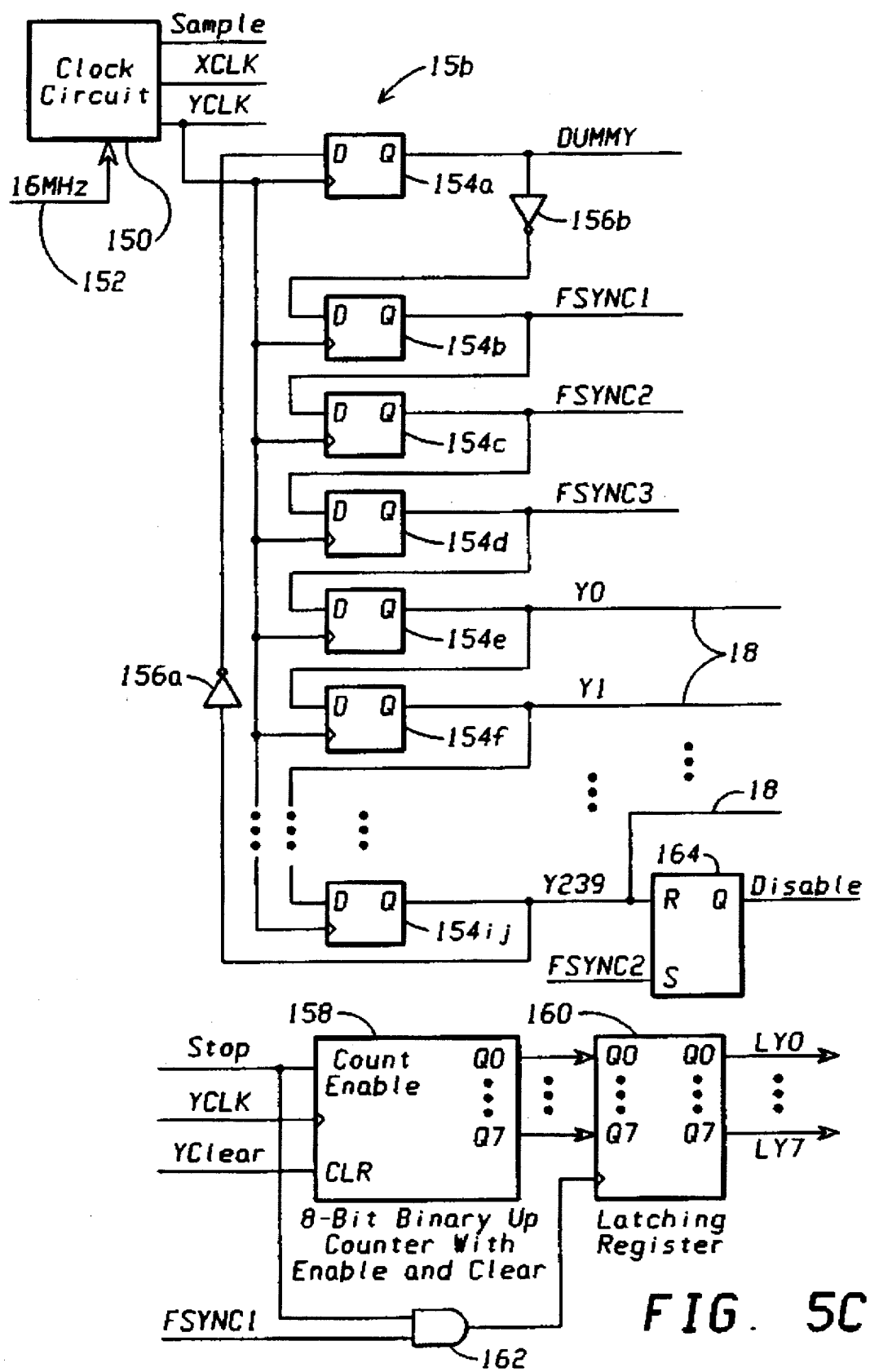
FIG. 5C is an electrical schematic diagram showing the details of the y-drivers for the electrical circuit for interfacing to the touchpad sensor shown in FIGS. 1A–1E.

The circuitry of the y-driver PLDs 130a–130e is shown in FIG. 5C. As shown in that figure, the SAMPLE, XCLK, and YCLK signals are generated by a clock circuit 150 from a 16 MHz digital signal 152. The 16 MHz signal 152 can be generated by a hybrid oscillator, a crystal and several inverting Schmitt triggers, and other methods well known in the art. The YCLK signal is a digital signal that has a 20.5 μs period and can be generated by decoding a signal that has a period that is 328 cycles of the 16 MHz clock signal 152. In this embodiment, the XCLK is the 16 MHz signal 152.

The y-driver circuit comprises 244 D-flip flops 154 that are connected in a self-starting ring counter configuration 156 with two inverters 156, as is known in the art and shown in FIG. 5C. The 244 stages are divided between the 5 PLDs 130a–130e. If different density PLDs are used, more or fewer PLDs might be needed to implement all 244 stages. The last output of the previous PLD is connected to an input, labeled IN, of the next PLD by a ring counter connection 142, as is show in FIG. 5B. The counter connections 142 allow the logical ONE in the ring counter 156 to be shifted through all 244 stages with only one data line connecting the PLDs.

Figure 5D:
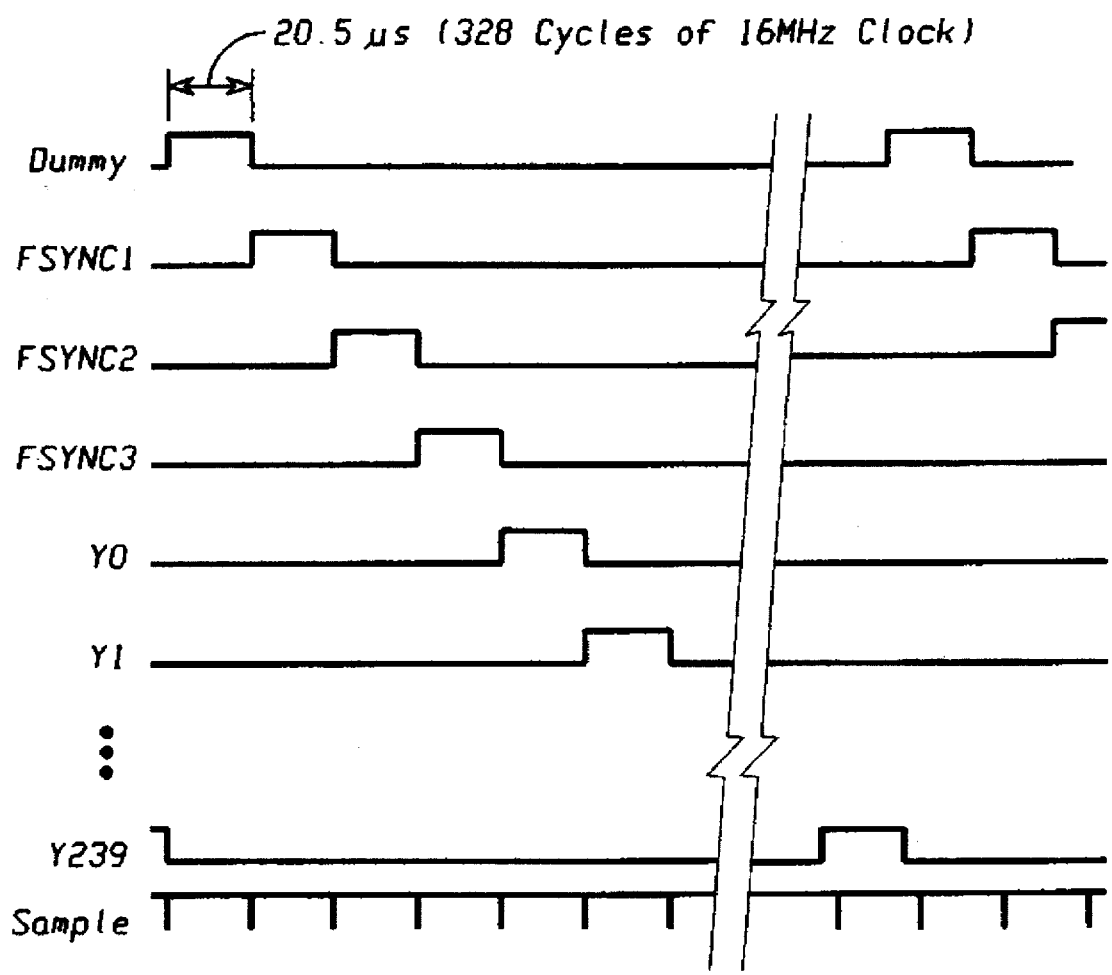
FIGS. 5D and 5E are waveform diagrams showing the relationships between several selected signals of the circuit shown in FIGS. 5B and 5C.

The ring counter 156 generates the 240 y-driver signals Y0–Y239, the timing signals FSYNC1-3, and a DUMMY signal. The FSYNC signals are used for timing purposes throughout the circuitry. The flip flops 154 reset such that Q=0 on powerup; therefore, before first cycle of YCLK, the DUMMY signal, the FSYNC signals, and the Y signals are all a logical ZERO. After the first period of YCLK, a ONE appears at FSYNC1 and all the others remain a ZERO. After the next period of YCLK, FSYNC1 changes to a ZERO and FSYNC2 changes to a logical ONE. Successive cycles of YCLK cause the logical ONE to appear to be passed from one D-flip flop to the next, as is known in the art and shown in FIG. 5D. As shown in that figure, each Y line (as well as each FSYNC and the DUMMY signal) is sequentially held to a logical ONE for 328 cycles of the 16 MHz clock (20.5 µs).

Figure 5E:
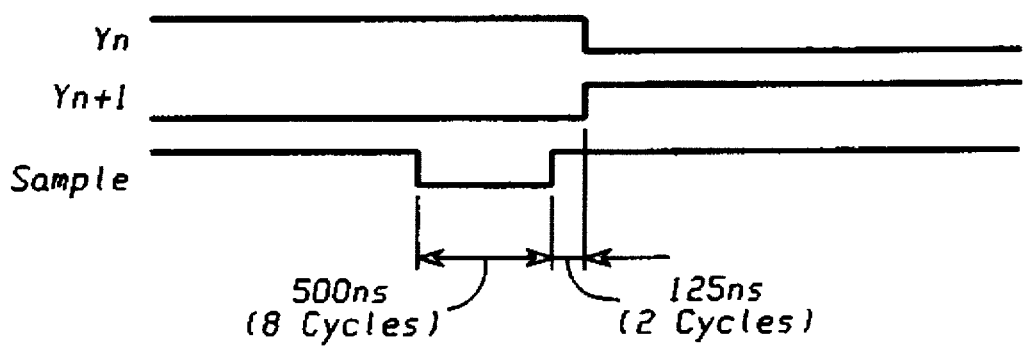

The details of the SAMPLE signal are shown in FIG. 5E. The SAMPLE signal was generated using a binary up counter, combinatorial logic, and an R-S latch (all not shown), with the SAMPLE signal being the output of the latch. Such circuits are known in the art. Essentially, 318 cycles of the 16 MHz clock into the 328-cycle period of each Y line, the latch is RESET by the logic, thereby allowing the SAMPLE signal to fall low. Eight complete cycles of the 16 MHz clock (500 ns) later, the latch is SET by the logic, thereby causing the SAMPLE signal to rise high again. Two cycles of the 16 MHz clock (125 ns) later, $Y_n$ becomes inactive and $Y_{n+1}$ becomes active.

Referring back to FIG. 5C the remaining y-driver circuitry is also shown. A y-counter 158 and y-latch 160 are placed in circuit communication as shown. The y-counter 158 is an 8-bit binary up counter with count enable and clear, as is known in the art. The y-latch is an 8-bit latching register, as is known in the art. An AND gate 162 generates a signal that latches the register responsive to the STOP and FSYNC1 signals, also as shown in that figure. In addition, an R-S latch generates 164 the DISABLE signal responsive to Y239 and FSYNC2, as shown.

Figure 5F:
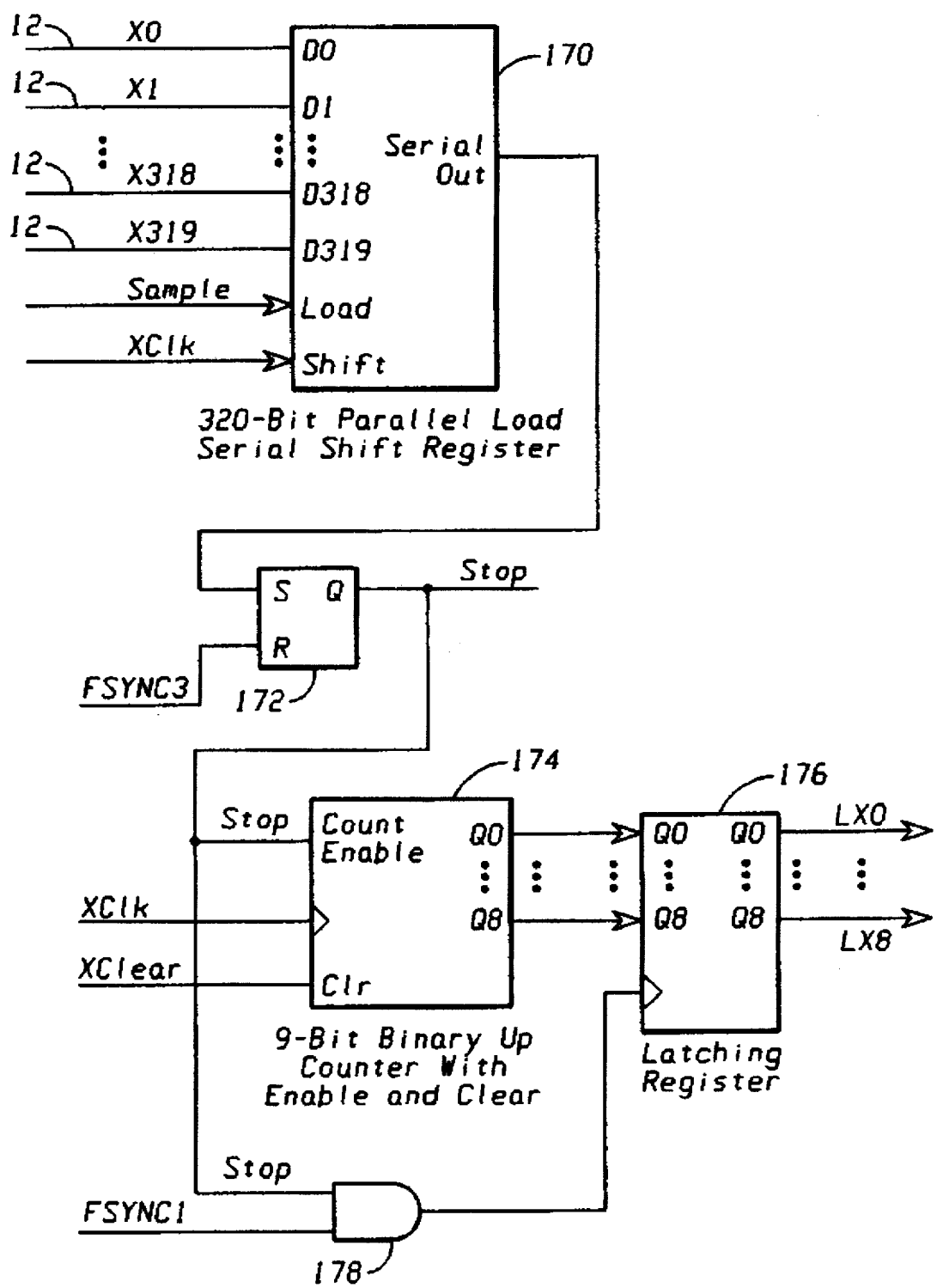
FIG. 5F is an electrical schematic diagram showing the details of the x-receivers for the electrical circuit for interfacing to the touchpad sensor shown in FIGS. 1A–1E.

Referring now to FIG. 5F, the circuitry of the x-driver PLDs 130f–130k is shown. As shown in that figure, the x-receivers are implemented by a 320-bit parallel load/serial shift register (PLSSR) 170, an R-S latch 172, a 9-bit binary up counter 174 with count enable and clear, a 9-bit latching register 176, and an AND gate 178, placed in circuit communication as shown in that figure.

In this particular embodiment, the 320-bit PLSSR 170 is divided between the six PLDs 130f–130k. If different density PLDs are used, more or fewer PLDs might be needed to implement all 320 stages. The stages of the PLSSR 170 can be functional building blocks equivalent to the well known 74165. All six PLDs 130f–130k are connected to the SAMPLE signal and the six PLDs 130f–130k are linked serially by serial connections 180, shown in FIG. 5B. The output, labelled O, of the previous PLD is connected to the input, labelled I, of the next PLD, as shown in that figure. The input of the last PLD 130k is tied to ground. The serial connections 180 allow the data in the PLSSR to be shifted through all 320 stages with only one data line connecting the PLDs.

Referring now to FIGS. 5A–5F collectively, at the beginning of a scan for a touch, the counters 158, 174 are reset to 00H, the STOP signal generated by R-S latch 172 is a logical ZERO, and the SAMPLE signal generated by the clock circuit 150 and the DISABLE signal generated by R-S latch 164 are a logical ONE. Every 20.5 µs, the logical ONE in the ring counter 156 is passed from the current stage $Y_n$ to the next stage $Y_{n+1}$ responsive to the YCLK. As explained above, each y-driver is held at a logical ONE (+5 VDC) for 20.5 µs. The 20.5 µs value is somewhat arbitrary, but is believed to provide a comfortable medium between very rapid scanning, which is governed by the time-constant of each conductor and which would increase the electromagnetic interference with surrounding electronic devices, and very slow scanning, which would cause the scanning rate to be too slow for digitizing the fluid stylus strokes of, for example, handwriting.

As each y-conductor is driven by its associated y-driver, the y-counter 158 counts responsive to the YCLK. Thus, the value of the y-counter 158 corresponds to the y-conductor currently being driven. The y-counter 158 is configured to be reset to 00H responsive to YCLEAR. YCLEAR is asserted responsive to a completed scan of all y-conductors.

At 19.875 µs into the 20.5 µs assertion period of each y-driver, the SAMPLE signal is asserted by placing it at a logical ZERO and placing it at a logical ONE 500 ns later, as shown in FIG. 5E. Responsive to the SAMPLE signal being asserted, the PLSSR 170 latches the contents of all the x-conductors 12. Normally, all the latched x-conductor values will be at logical ZERO. If the y-conductor that is being driven to a logical ONE is touching one of the x-conductors in the manner shown in FIG. 1E, then one of the latched x-conductor values will also be a logical ONE. On the other hand, if the y-conductor that is at a logical ONE is not touching one of the x-conductors in the manner shown in FIG. 1E, then all of the latched values will be a logical ZERO. Immediately after latching the x-conductor values, the PLSSR 170 begins sequentially shifting all the x-conductor values responsive to the XCLK and sequentially inputting them to the R-S latch 172.

As each x-conductor value is shifted past the R-S latch 172, the x-counter 174 counts responsive to the XCLK. Thus, the value of the x-counter 174 corresponds to the x-conductor the value of which is being shifted past the R-S latch. The x-counter 174 is configured to be reset responsive to XCLEAR. XCLEAR resets the x-counter to 00H after all the x-conductor values have been shifted past the R-S latch 172, unless a ONE is detected, in which case the x-counter is cleared after the x-counter value has been latched into the x-latch 176 and before Y0 is driven.

In short, each y-conductor 18 is sequentially raised to a voltage corresponding to a logical ONE. While each y-conductor is a logical ONE, the value of all the x-conductors 12 are simultaneously latched and then very rapidly serially shifted to detect the presence of a logical ONE, which indicates a closure event as shown in FIG. 1E. After each cycle of sequentially driving all the y-conductors 18, the R-S latch 164 clears the DISABLE signal responsive to Y239, thereby signaling to the microcontroller 132 that data is about to change and therefore disabling data reads by the microcontroller 132.

If none of the x-conductor values are a ONE, then no closure event has taken place and the y-counter 158 and x-counter 174 count while the y-conductors continue to be sequentially driven and the x-conductor values continue to be simultaneously latched and serially shifted.

On the other hand, if one of the x-conductor values shifted past the R-S latch 172 is a logical ONE, the output of the R-S latch 172 becomes a logical ONE thereby asserting the STOP signal. Responsive to the STOP signal being asserted the y-counter 158 and the x-counter 174 stop counting, even though the PLSSR 170 continues to shift the x-conductor values past the R-S latch 172 and the ring counter 156 continues to pass the logical ONE from one stage to the next. Thus, the moment the STOP signal is asserted, the coordinates of the touched location are contained in the counters 158, 174. The STOP signal remains asserted until the FSYNC3 signal of the next cycle becomes active.

Next, responsive to the STOP and FSYNC1 signals being asserted, the values in the counters 158, 174 are latched into their respective latches 160, 176. Finally, responsive to FSYNC2, the R-S latch 164 sets the DISABLE signal, thereby signaling to the microcontroller 132 that data is latched and available, thereby enabling data reads by the microcontroller 132.

The microcontroller 132 periodically polls the values latched in the latches 160, 176 responsive to the DISABLE signal. The microcontroller 132 then encodes the data into a format suitable for serial transmission over the serial line to the personal computer. The exact data encoding algorithm is not critical and depends entirely upon the software driver executing on the computer system; different software drivers might require the data to be different formats, as known to those skilled in the art. The data must match the software on the computer system. Alternatively, the data can be compressed using any of the well known compression algorithms. The encoded values are transmitted out the TxD output of the microcontroller 132 via the RS-232 driver 120 to pin 2 of the DB-9 connector 140.

Alterations and modifications to the circuitry will be apparent to those skilled in the art. For example, the Y lines can be defaulted to a logical ONE and a logical ZERO passed around the ring counter 156. As another example, the drivers and receivers need not be implemented in PLDs. Rather, an application-specific integrated circuit (ASIC) could be designed and fabricated to perform the required interface functions. In addition, the 244-bit ring counter 156, the 320-bit PLSSR 170, and the other circuitry can be implemented on a single massive ASIC. Such an ASIC might use active pullups and pulldowns instead of the passive pulldown resistors 138. Such circuits are known in the art and use, for example, two NPN transistors, with the collector of the first connected to the emitter of the second, the emitter of the first connected through a resistor to a voltage associated with a logical ONE, the collector of the second connected through a resistor to a voltage near ground, the bases of the transistors connected to respective driver circuitry, and the tied emitter-collector connected to the x-conductors.

Figure 6:
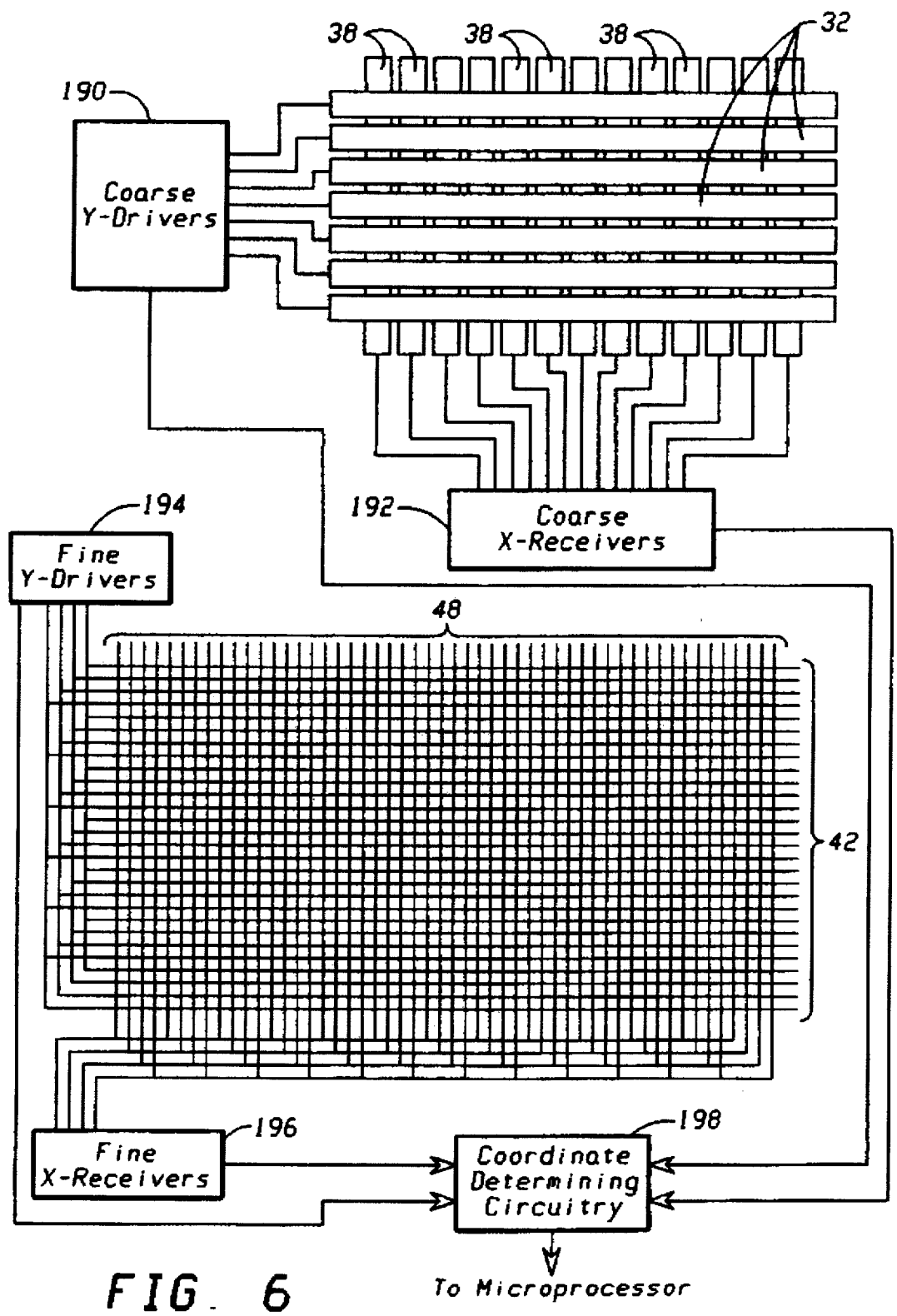
FIG. 6 is an electrical block diagram showing the major components of an embodiment of an electrical circuit for interfacing to the dual sensor shown in FIGS. 2A–2E.

Referring now to FIG. 6 a block diagram of the electronics used to interface to the dual sensor of the present invention is shown. The circuitry includes coarse y-drivers 190, coarse x-receivers 192, fine y-drivers 194, and fine x-receivers 196 all in circuit communication with coordinate determining circuitry 198. As with the circuit of FIGS. 5A, 5B, and 5F, each of the coarse y-drivers 190 drives a single coarse y-conductor 32. Likewise, each of the coarse x-receivers 192 receives data from a single coarse x-conductor 38.

However, the fine conductors 42, 48 are different. Each of the fine y-drivers 194 drives more than one fine y-conductor 42. Likewise, each of the fine x-receivers 196 receives data from more than one fine x-conductor 48. In FIG. 6, the ratio is four fine conductors per coarse conductor along both axes. Preferably a ratio of 16 fine conductors per coarse conductor along both axes would be used. Thus, there would be fifteen coarse y-conductors 32 corresponding to the 240 fine y-conductors 42, and twenty coarse x-conductors 38 corresponding to the 320 fine x-conductors 48.

The coordinate determining circuitry 198 can be designed very similarly to the circuits of FIGS. 5B–5F. A pair of ring counters can be used to sequentially drive the coarse and fine y-conductors 32, 42. A pair of parallel load/serial shift registers can be used to simultaneously sample the coarse and fine x-conductors 38, 48. The circuitry 198 differs from that in FIGS. 5B–5F in that the intersection of the coarse conductors 32, 38 and the intersection of the fine conductors 42, 48 are used to determine the exact location of the touched region.

For example, using the device of FIG. 6, the coarse intersection might indicate that the touch is four coarse rows down and five coarse columns over and the fine intersection might indicate that the touched location is three fine rows down and two fine columns over. The exact location would be determined by the fine value plus the coarse value times the number of fine conductors per coarse conductor. In the above example the exact location would be 19 (3+4×4) fine y-conductors down by 22 (2+5×4) fine x-conductors over.

Many configurations are possible for the coordinate determining circuitry 198. The critical aspect is to use both intersections of the dual sensor to determine the coordinates of the touched location. For example, the y-counter and x-counter could be implemented with two counting inputs: a count-by-four input and a count-by-one input. Like the circuit in FIGS. 5A–5F, the two counters would count until an intersection is detected. Unlike the circuit in FIGS. 5A–5F, the counters would first count by fours (i.e., count by the number of fine conductors per coarse conductors on that axis) until a coarse intersection is detected and then count by ones until a fine intersection is detected. Many circuits are possible and within the skill of those skilled in the art.

Using the dual sensor greatly simplifies and reduces the size of the electronics needed to determine the coordinates of the touched location. The 320-by-240 circuit of FIG. 5B requires 560 drivers and receivers: 240 y-drivers and 320 x-receivers. By comparison, a dual sensor of the same 320-by-240 resolution could be made with 16 fine y-conductors per coarse y-conductor and 16 fine x-conductors per coarse x-conductor. A coordinate determining circuit 198 to interface to such a 320-by-240 dual sensor would need only 67 drivers and receivers: 15 individual coarse y-drivers, 20 individual coarse x-receivers, 16 individual fine y-drivers, and 16 individual x-receivers. Moreover, either the coarse and fine y-drivers or the coarse and fine x-receivers can be shared, thereby further reducing the driver and receiver count to 51. That is, the y-drivers can each drive one coarse y-conductor and sixteen fine y-conductors. In the alternative, the x-receivers can each receive data from one coarse x-conductor and sixteen fine x-conductors. Thus, the dual sensor greatly reduces the number of drivers and receivers needed to interface to the circuit.

Reducing the number of drivers and receivers reduces both the size and the cost of the electronics. The circuits require one device pin per driver and one device pin per receiver. The circuit of FIG. 5B has 560 drivers and receivers requiring 560 device pins and therefore used nine large EPLDs, which could only be replaced by an equally large ASIC or ASICs. The device described in the above paragraph can be made with 67 or as little as 51 drivers and receivers, thereby allowing the entire circuit to be designed into a single EPLD or a very small ASIC. The reduction in pin-count is virtually an order of magnitude less. Consequently, a much smaller and less costly electronic interface circuit can be used with the dual sensor.

Figure 7A:
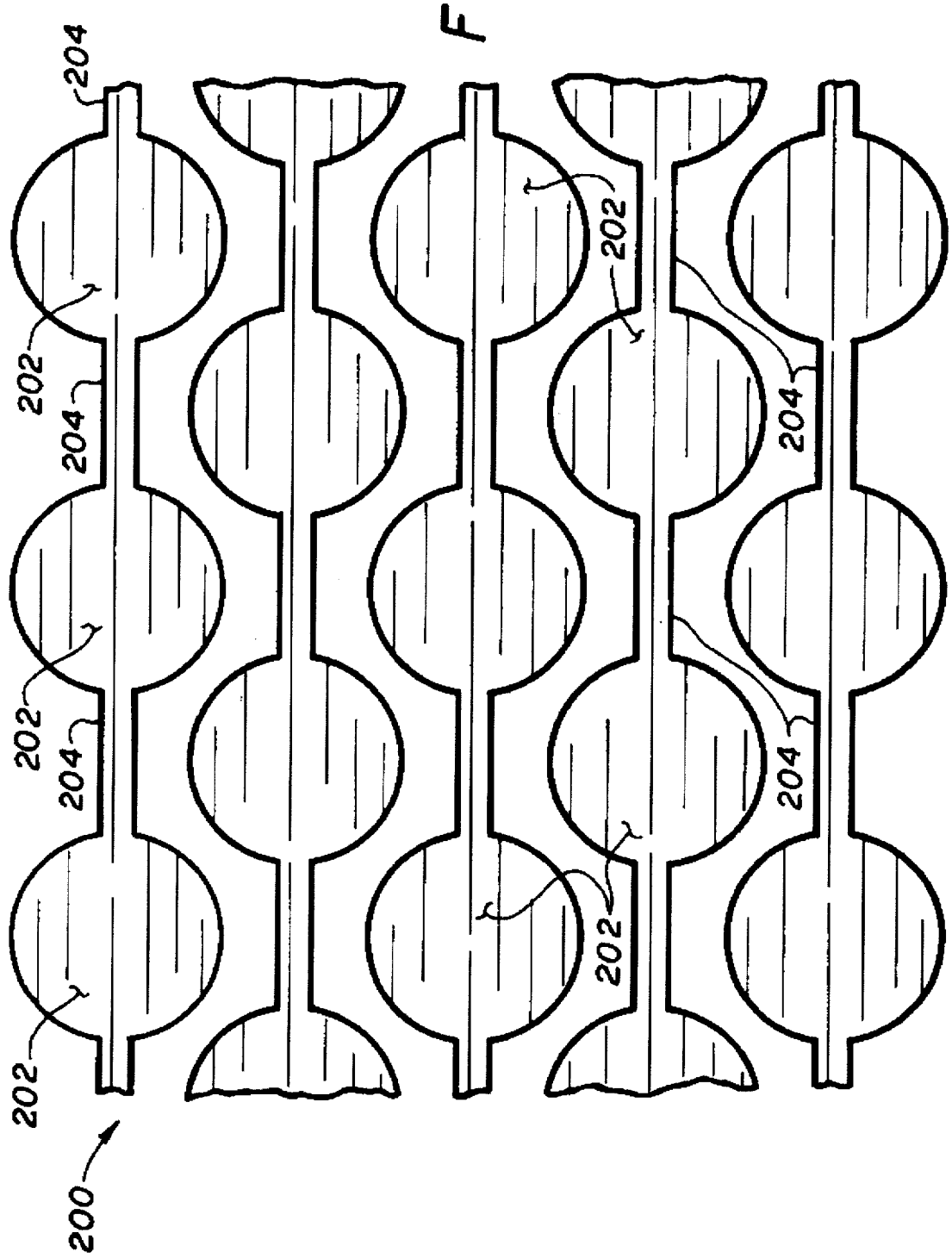
FIG. 7A is a top view of one layer of conductors of yet another embodiment of the touchpad sensor.
Figure 7C:
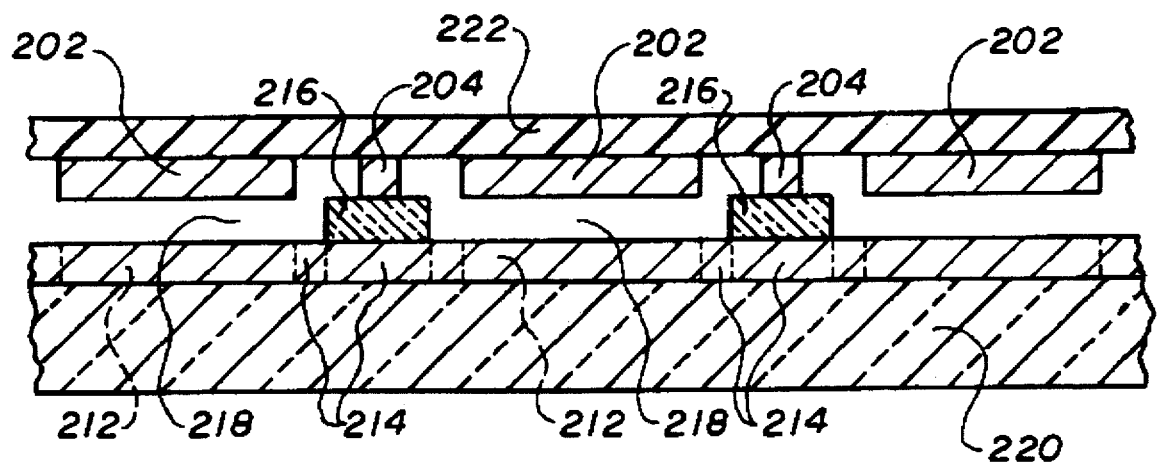
FIG. 7C is a side elevational view of the embodiment shown in FIG. 7B taken along the line 7C—7C.

Referring now to FIGS. 7A–7C, another embodiment of the sensor is shown. In the previously described embodiments, the conductors were shown as being rail-like. That is, the conductors were shown as being shaped substantially like rectangular parallelopipeds with one axis substantially greater in length than either of the other two axes. However, other conductor shapes are possible.

In the previous embodiments, the possible intersection area is relatively small in comparison to the total area of the touchpad sensor surface. A significant number of blind spots exist. For example, it is conceivable that a user might draw a substantially horizontal or vertical line with the stylus that lies substantially on top of an insulator. Very few intersections would occur and therefore, the input to the personal computer would be a poor approximation of the actual touched locations. Analytically, if the conductors are the same width as the insulators, then only approximately 25% of the surface can act as a contact area. Practically speaking, this is not a serious drawback because the tip of the stylus tends to slip off of the conductor and into one of the contact areas.

Even so, other configurations can greatly increase the total contact area. FIG. 7A shows one pattern of conductors 200 that results in significantly fewer blind spots. The pattern consists of circular conductive pads 202 connected by conductive isthmuses 204. The plurality of conductive paths formed by the pads 202 and the isthmuses 204 are non-intersecting and lie longitudinally, as in the other embodiments. The pads 202 and isthmuses 204 can be of the same materials as described in the previous embodiments. In FIG. 7A the pads 202 are circular in shape; however, other pad shapes are possible. Preferably, the pads are such that the total contact area as a percentage of total sensor surface area is higher than that of the embodiment of FIGS. 1A–1C. As with the previous embodiments, the size and spacing of the pads and isthmuses depends on the desired resolution of the sensor. Preferably, the pads 202 are substantially the same size and are spaced substantially equidistant from each other. Preferably the isthmuses are substantially the same size and are spaced substantially equidistant from each other.

FIG. 7B shows a touchpad sensor 210 comprising two of the patterns of FIG. 7A. The first pattern has pads 202 and isthmuses 204 and the second pattern has pads 212 and isthmuses 214. The second pattern is rotated 90° such that the conductive paths of each are skewed and preferably orthogonally to each other. The two patterns are separated by insulating pads 216 at the intersections of the isthmuses 204, 214 as viewed from the top.

The relationship between the two patterns is better understood with reference to FIG. 7C. FIG. 7C shows the insulating pads 216, conductive pads 202, 212, and the isthmuses 204, 214. The insulating pads 216 are configured such that conductive pads 202, 212 are separated by a gap 218. As with the previous embodiments, the gap can be air or an inert gas. Also, as with the embodiment of FIGS. 1A–1C, the pads 212 and isthmuses 214 are disposed on a rigid substrate 220 and the pads 202 and isthmuses 204 are disposed on a flexible substrate 222. The conductive pads 202, 212 and conductive isthmuses 204, 214 can be made of the same materials and applied in the manner as the conductors described above. The insulating pads 216 can be made of the same materials and applied in the manner as the insulators described above.

Analytically, the contact area of the embodiment of FIG. 7B is approximately 40% of the total area of the sensor surface. If the circular conductive pads are increased in size until they are just separated, the contact area can be approximately 75% of the total sensor surface area.

The electronics for driving the embodiment of FIG. 7B is very similar if not identical to that shown in FIGS. 5A–5F. One possible modification is to slightly skew the resulting coordinates because in the sensor of FIGS. 1A–1C the adjacent contact areas are horizontal and vertical and in the embodiment of FIG. 7B, the adjacent contact areas lie along diagonals.

Figure 8:
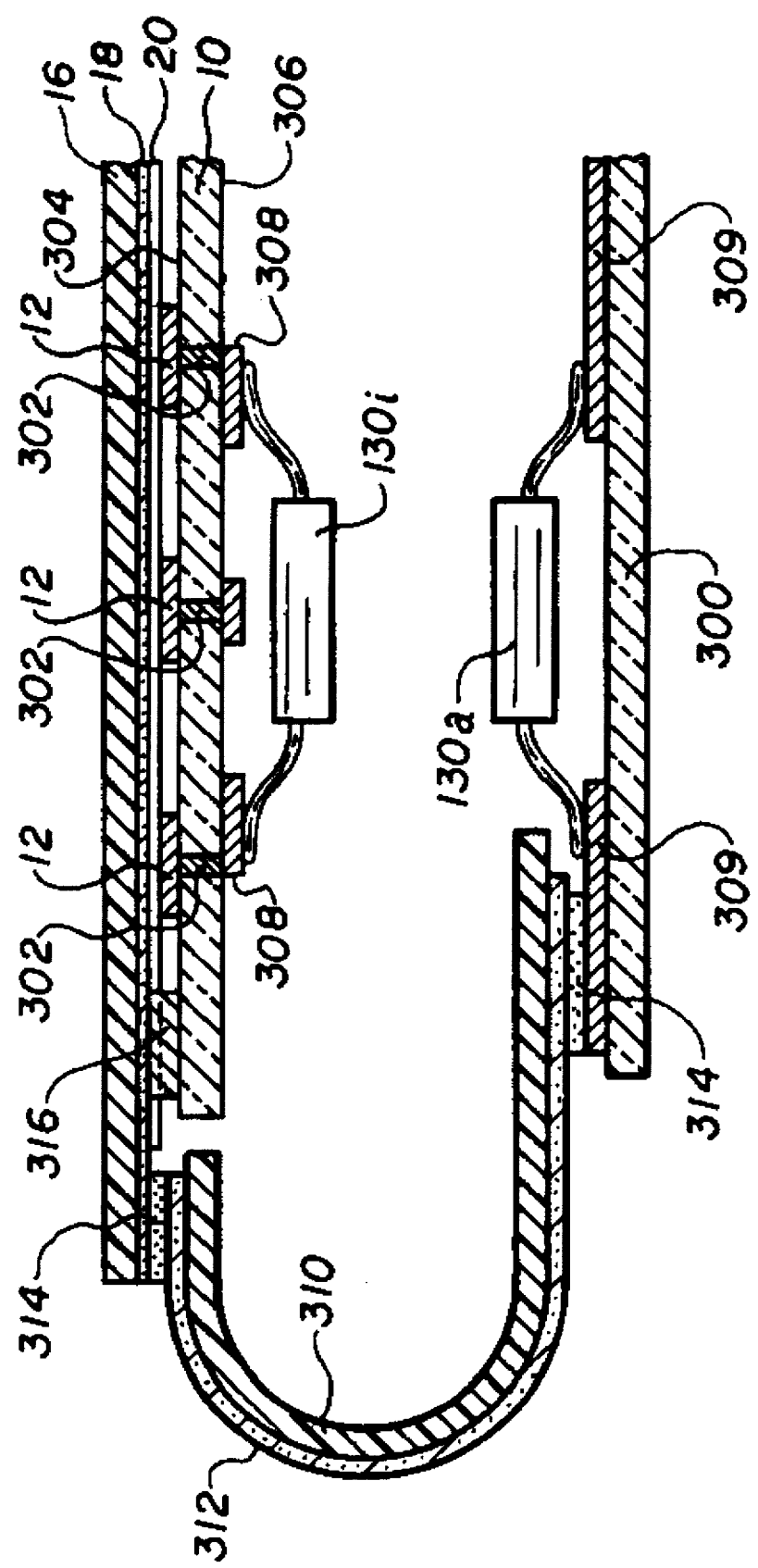
FIG. 8 is a side elevational view of the construction of the embodiment shown in FIGS. 1A–1E with the integrated circuits embodying the circuitry of FIGS. 5A–5F.

Referring now to FIG. 8, the electrical connections of the various conductors to the circuit components is shown, somewhat diagrammatically. As can be seen in FIG. 8, the many integrated circuits of FIGS. 5A–5E are mounted on two double-sided printed circuit boards 10, 300. The printed circuit board 10 is the same board 10 used as the substrate for the embodiment of the sensor shown in FIGS. 1A–1E. The conductors 12 on the one side 304 of the substrate 10 are connected through vias 302 formed through the substrate 10 to the circuitry 130f–130k via circuit traces 308 on the opposite side 306 of the substrate 10.

The other circuitry 130a–130e is disposed on the second PCB 300 and electrically connected to printed circuit traces 309. The conductors 18 on the membrane 16 are connected to electrical circuitry 130a–130e via a 240-line flexible connector cable 310 having circuit traces 312 thereon. The cable 310 can be made of the same material as the other flexible membranes 16, 36, and 46. The circuit traces 312 can be made of conductive ink like the conductors 18, 38, 42, and 48 and applied as such. The connection of the cable 310 to the conductors 18 and traces 309 is preferably by conducting adhesive 314. The adhesive can be an anisotropic conductive adhesive such as an epoxy with conducting particles suspended therein, as is known in the art. The conductors are aligned, the adhesive is applied, and the bond area is heated, and held under pressure until the epoxy sets. The anisotropic adhesive provides electrically conducting adhesion between the conductors 312 and 18 and conductors 312 and 309 and non-electrically conducting adhesion elsewhere. The substrate 300 also is preferably formed of glass-filled epoxy, such as FR4 and has mounted on the top surface additional circuit chips to perform the functions of FIGS. 5A–5F. Various other components (not shown) are mounted on the boards 10 and 300, such as the diodes 136 and resistors 138, both in surface mount form. The boards 10 and 300 are interconnected by stand-offs (not shown), which are well known in the art. The same arrangement of circuitry is used for the dual sensor of the present invention.

Although not necessary, the two substrates 10, 16 can be sealed with a sealing material 316. Many materials are suitable, such as transfer adhesives and their equivalents and injected adhesives. Such adhesives are known in the art and available from numerous sources, such as the 3M Company.

The following signals are communicated between the two boards 10, 300 with well known inter-PCB connectors: the 16 Mhz clock, SAMPLE, FSYNC1, FSYNC2, FSYNC3, STOP, LX0–LX8, and the power supply sources. The entire structure is then enclosed in a sealable case (not shown), which can be hermetically sealed, as known by those skilled in the art. This case may include an additional flexible membrane covering the substrate 16 to improve its scratch and wear resistance.

The same type of physical sealing and mounting is applicable to a touchpad made with the dual sensor of the present invention.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. For example, different shapes of conductors might increase the contact area even further and still provide sufficient electrical isolation between the circuits. As another example, two fine sensors of FIGS. 1A–1E can be sandwiched in the manner of FIGS. 2A–2E and aligned such that the conductors of one overlap the insulators of another, thereby achieving a composite contact area of virtually 100%. Therefore, the invention in its broader aspects is not limited to the specific details, representative apparatus and method, and illustrative examples shown and described. Accordingly, departures may be made from such details without departing from the spirit or scope of the applicant's general inventive concept.

We claim:

1. A dual sensor comprising:
   (a) a first touchpad sensor having first and second pluralities of conductors associated therewith, and a first touchpad resolution; and
   (b) a second touchpad sensor substantially the same size as said first touchpad sensor, having a second touchpad resolution, and positioned proximate to said first touchpad sensor, said second touchpad sensor having third and fourth pluralities of conductors associated therewith;
   (1) wherein said first touchpad resolution is different from said second touchpad resolution; and
   (2) wherein said first and second touchpad sensors are configured and positioned such that a single touch of a finger, stylus, or the like is detectable by both said first touchpad sensor and said second touchpad sensor, said single touch causing at least one of said first plurality of conductors to coact with at least one of said second plurality of conductors such that the location of the touch can be determined therefrom and further causes at least one of said third plurality of conductors to coact with at least one of said fourth plurality of conductors such that the location of the touch can be determined therefrom.

2. The dual sensor of claim 1 wherein said first touchpad sensor is aligned substantially orthogonally with respect to said second touchpad sensor in plan view.

3. The dual sensor of claim 1 wherein said first touchpad sensor has one fourth the resolution of said second touchpad sensor.

4. A dual sensor comprising:
   (a) a first plurality of parallel conductors each spaced from adjacent conductors of said first plurality of parallel conductors by a pair of insulators of a first plurality of insulators;
   (b) a second plurality of parallel conductors proximate to said first plurality of conductors, positioned skewed with respect to said first plurality of conductors in plan view, and each spaced from adjacent conductors of said second plurality of parallel conductors by a pair of insulators of a second plurality of insulators;
   (c) a third plurality of parallel conductors proximate to said first plurality of conductors and each of said third plurality of conductors spaced from adjacent conductors of said third plurality of parallel conductors by a pair of insulators of a third plurality of insulators; and
   (d) a fourth plurality of parallel conductors proximate to said third plurality of conductors, positioned skewed with respect to said third plurality of conductors in plan view, and each spaced from adjacent conductors of said fourth plurality of parallel conductors by a pair of insulators of a fourth plurality of insulators;
   (1) wherein said first plurality of conductors are configured to lie substantially in a first plane;
   (2) wherein each of said first plurality of insulators extends beyond said first plane toward said second plurality of conductors;
   (3) wherein said third plurality of conductors are configured to lie substantially in a second plane; and
   (4) wherein each of said third plurality of insulators extends beyond said second plane toward said fourth plurality of conductors.

5. The dual sensor of claim 4 wherein said first plurality of conductors is aligned substantially orthogonally with respect to said second plurality of conductors and said third plurality of conductors is aligned substantially orthogonally with respect to said fourth plurality of conductors in plan view.

6. A dual sensor comprising:
   (a) a first plurality of conductors that are flexible, spaced from adjacent conductors by a first plurality of insulators, and substantially parallel to each other;
   (b) a second plurality of conductors proximate to said first plurality of conductors, substantially parallel to each other, skewed with respect to said first plurality of conductors in plan view, and spaced from adjacent conductors of said second plurality of conductors by a second plurality of insulators;
   (c) a stylus surface proximate to said first plurality of conductors for accepting pressure from a finger, a stylus, or the like;
   (d) a third plurality of conductors that are flexible, positioned proximate to said first plurality of conductors, spaced from adjacent conductors by a third plurality of insulators, and substantially parallel to each other; and
   (e) a fourth plurality of conductors proximate to said third plurality of conductors, substantially parallel to each other, skewed with respect to said third plurality of conductors in plan view, and spaced from adjacent conductors of said fourth plurality of conductors by a fourth plurality of insulators;
   (1) wherein each of said conductors of said first and second pluralities of conductors and each of said insulators of said first and second pluralities of insulators is configured and positioned such that each of said first plurality of conductors has two states: a relaxed state and a flexed state; said relaxed state being characterized by said conductor not being in electrically conducting contact with any of said conductors of said second plurality of conductors; and said flexed state being characterized by said conductor being in electrically conducting contact with at least one conductor of said second plurality of conductors;
   (2) wherein each of said conductors of said first and second pluralities of conductors and each of said insulators of said first and second pluralities of insulators is further configured such that the asserting a predetermined amount of pressure from a finger, stylus, or the like to said stylus surface causes at least one of said first plurality of conductors in said relaxed state to enter said flexed state and removing the predetermined amount of pressure from said stylus surface causes said at least one of said conductors in said flexed state to enter said relaxed state;

(3) wherein each of said conductors of said third and fourth pluralities of conductors and each of said insulators of said third and fourth pluralities of insulators is configured and positioned such that each of said third plurality of conductors has two states: a relaxed state and a flexed state; said relaxed state being characterized by said conductor not being in electrically conducting contact with any of said conductors of said fourth plurality of conductors; and said flexed state being characterized by said conductor being in electrically conducting contact with at least one conductor of said fourth plurality of conductors; and (4) each of said conductors of said third and fourth pluralities of conductors and each of said insulators of said third and fourth pluralities of insulators is further configured such that the asserting a predetermined amount of pressure from a finger, stylus, or the like to said stylus surface causes at least one of said third plurality of conductors in said relaxed state to enter said flexed state and removing the predetermined amount of pressure from said stylus surface causes said at least one of said conductors in said flexed state to enter said relaxed state.

7. The dual sensor of any one of claims 1, 4, or 6 further comprising:

(a) a plurality of drivers in circuit communication with said first plurality of conductors and said third plurality of conductors for placing an electrical signal onto any conductor of said first or third pluralities of conductors, each of said drivers being in circuit communication with one conductor of said first plurality of conductors and each of said drivers being in circuit communication with at least two conductors of said third plurality of conductors;

(b) a plurality of receivers in circuit communication with said second plurality of conductors and said fourth plurality of conductors for detecting an electrical signal on any conductor of said second or fourth pluralities of conductors, each of said receivers being in circuit communication with one conductor of said second plurality of conductors and each of said receivers being in circuit communication with at least two conductors of said fourth plurality of conductors.

8. The dual sensor of any one of claims 1, 4, or 6 further comprising a plurality of drivers in circuit communication with said third plurality of conductors for placing an electrical signal onto any conductor of said third plurality of conductors, each of said drivers being in circuit communication with at least two conductors of said third plurality of conductors.

9. The dual sensor of any one of claims 1, 4, or 6 further comprising a plurality of receivers in circuit communication with said fourth plurality of conductors for detecting an electrical signal on any conductor of said fourth plurality of conductors, each of said receivers being in circuit communication with at least two conductors of said fourth plurality of conductors.

10. The dual sensor of any one of claims 4 or 6 wherein said insulators of said first and second pluralities of insulators comprise air and said insulators of said third and fourth pluralities of insulators comprise a different dielectric.

11. The dual sensor of any one of claims 4 or 6 wherein said conductors of said first plurality of conductors comprise copper covered with gold flash and said conductors of said second, third, and fourth pluralities of conductors comprise silver ink.

12. The dual sensor of any one of claims 4 or 6 wherein said conductors and insulators are deposited onto at least three substrates.

13. A method of fabricating a touchpad sensor comprising the steps of:

(a) affixing a first plurality of conductors onto a first substrate;

(b) affixing a second plurality of conductors onto the first side of a second substrate;

(c) affixing a first plurality of insulators onto the first side of said second substrate;

(d) affixing a third plurality of conductors onto the second side of said second substrate;

(e) affixing a second plurality of insulators onto the second side of said second substrate;

(f) affixing a fourth plurality of conductors onto a third substrate; and (g) positioning said first, second, and third substrates such that said insulators of said first plurality of insulators are in physical contact with said first plurality of conductors, said insulators of said second plurality of insulators are in physical contact with said fourth plurality of conductors, said insulators of said first plurality of insulators prevent physical contact between said conductors of said first and second pluralities of conductors until a localized pressure is applied, said insulators of said second plurality of insulators prevent physical contact between said conductors of said third and fourth pluralities of conductors until a localized pressure is applied, said first and second pluralities of conductors are skewed in plan view, said third and fourth pluralities of conductors are skewed in plan view.

14. The method of claim 13 wherein said step of affixing said first plurality of conductors onto said first substrate comprises the steps of:

(a) providing a copper-clad substrate; and (b) etching copper from said substrate leaving longitudinal conductive paths of copper affixed to said substrate.

15. The method of claim 13 wherein said step of affixing said second and third pluralities of conductors onto said second substrate comprises the steps of:

(a) providing a flexible substrate; and (b) printing conductive paths of a conductive ink onto both sides of said flexible substrate.

16. The method of claim 13 wherein said step of affixing said first and second pluralities of insulators onto said second substrate comprises the steps of:

(a) providing a flexible substrate; and (b) printing insulating paths of a printable insulating material onto both sides of said flexible substrate.

* * * * *